(12) United States Patent
Hirata et al.

(10) Patent No.: US 6,738,398 B2
(45) Date of Patent: May 18, 2004

(54) SHG LASER LIGHT SOURCE AND METHOD OF MODULATION FOR USE THEREWITH

(75) Inventors: Takaaki Hirata, Tokyo (JP); Shinji Iio, Tokyo (JP); Takeshi Inoue, Tokyo (JP); Yasuo Kitaoka, Tokyo (JP); Kazuhisa Yamamoto, Tokyo (JP)

(73) Assignees: Yokogawa Electric Corporation, Tokyo (JP); Matsushita Electric Industrial Co., Ltd., Osaka (JP)

( * ) Notice: Subject to any disclaimer, the term of this patent is extended or adjusted under 35 U.S.C. 154(b) by 526 days.

(21) Appl. No.: 09/728,439

(22) Filed: Dec. 1, 2000

(65) Prior Publication Data

US 2001/0005388 A1 Jun. 28, 2001

(30) Foreign Application Priority Data

Dec. 22, 1999 (JP) .............................. 11-364276
May 16, 2000 (JP) ...................... 2000-143262
Jul. 19, 2000 (JP) ...................... 2000-219021

(51) Int. Cl.⁷ .............................. H01S 3/13; H01S 3/10
(52) U.S. Cl. ...................... 372/32; 372/22; 372/29.014; 372/29.015
(58) Field of Search .............................. 372/20, 22, 25, 372/28, 50, 96, 32, 29.014, 29.015

(56) References Cited

U.S. PATENT DOCUMENTS

| | | | | |
|---|---|---|---|---|
| 4,719,636 A | * | 1/1988 | Yamaguchi ................... | 372/50 |
| 4,920,542 A | * | 4/1990 | Brosson et al. ................ | 372/50 |
| 5,177,758 A | * | 1/1993 | Oka et al. ..................... | 372/50 |
| 5,191,590 A | * | 3/1993 | Kuindersma et al. ......... | 372/50 |
| 5,220,578 A | * | 6/1993 | Koch et al. .................... | 372/96 |
| 5,325,382 A | * | 6/1994 | Emura et al. .................. | 372/26 |
| 5,450,428 A | * | 9/1995 | Maeda .......................... | 372/20 |
| 5,757,828 A | * | 5/1998 | Ouchi .......................... | 372/27 |
| 5,789,274 A | * | 8/1998 | Yamaguchi et al. ........... | 438/32 |
| 5,805,323 A | * | 9/1998 | Ichikawa ...................... | 359/205 |
| 5,832,014 A | * | 11/1998 | Johnson ........................ | 372/32 |
| 5,835,650 A | * | 11/1998 | Kitaoka et al. ................ | 385/49 |
| 6,021,141 A | * | 2/2000 | Nam et al. ..................... | 372/20 |
| 6,031,860 A | * | 2/2000 | Nitta et al. .................... | 372/50 |
| 6,041,071 A | * | 3/2000 | Tayebati ....................... | 372/64 |
| 6,064,681 A | * | 5/2000 | Ackerman ..................... | 372/32 |
| 6,331,908 B1 | * | 12/2001 | Adams et al. ................. | 359/188 |
| 6,359,915 B1 | * | 3/2002 | Koch et al. .................... | 372/29.02 |
| 6,373,802 B1 | * | 4/2002 | Hattori et al. .................. | 369/53.27 |
| 6,504,856 B1 | * | 1/2003 | Broberg et al. ................ | 372/38.07 |

FOREIGN PATENT DOCUMENTS

| | | |
|---|---|---|
| JP | 5053163 | 3/1993 |
| JP | 6273814 | 9/1994 |
| JP | 10-256676 | 9/1998 |
| JP | 11-232680 | 8/1999 |

* cited by examiner

*Primary Examiner*—David Porta
*Assistant Examiner*—Davienne Monbleau
(74) *Attorney, Agent, or Firm*—Moonray Kojima

(57) ABSTRACT

The invention provides an SHG laser light source whose optical output can be modulated using a simple mechanism without having to equip the light source with an external modulator, and a method of modulation for use with the SHG laser light source, wherein the SHG laser light source comprises a laser diode for outputting a fundamental wave of light, a drive circuit for simultaneously modulating one or more electric currents or voltages supplied to the laser diode to modulate the fundamental wave outputted by the laser diode, and an SHG device which receives the modulated or unmodulated fundamental wave, converts the wavelength thereof, and outputs a second harmonic wave which is intensity modulated.

20 Claims, 32 Drawing Sheets

FIG. 12
PRIOR ART
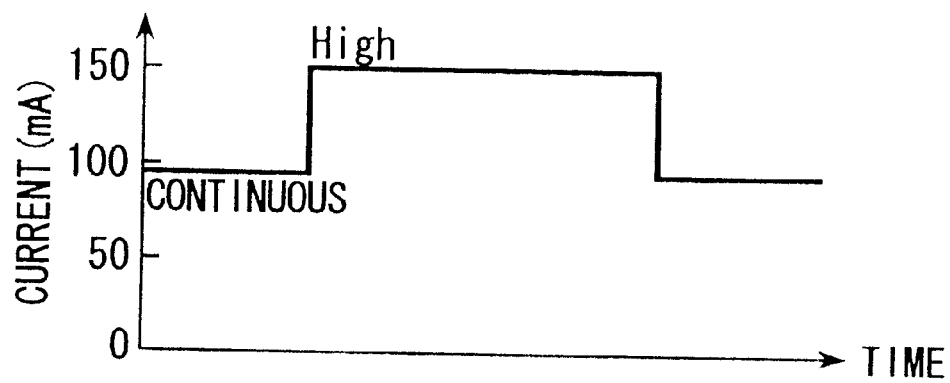
(a) INJECTION CURRENT INTO ACTIVE REGION
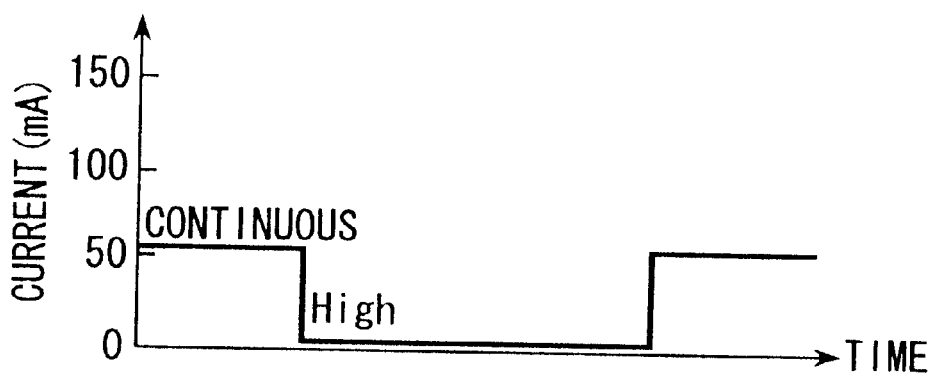
(b) INJECTION CURRENT INTO PHASE-CONTROL REGION
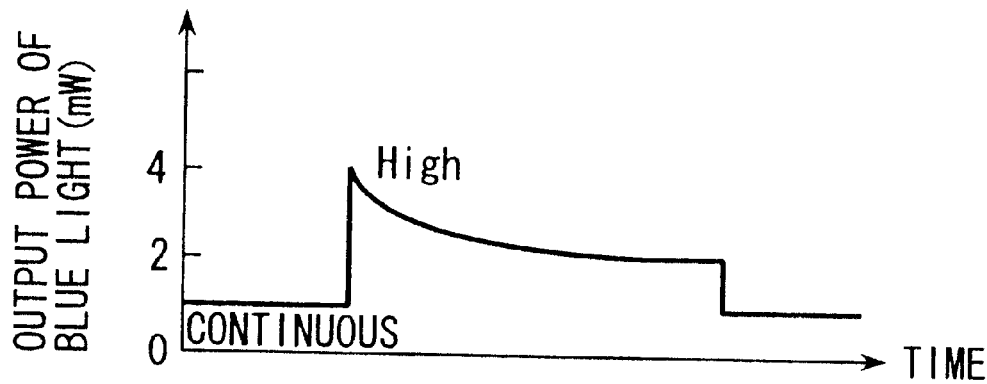
(c) OUTPUT POWER OF BLUE LIGHT

FIG. 13
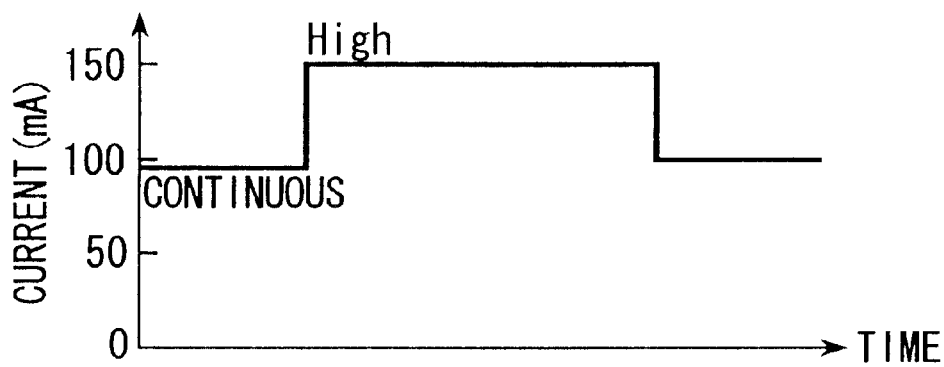
(a) INJECTION CURRENT INTO ACTIVE REGION
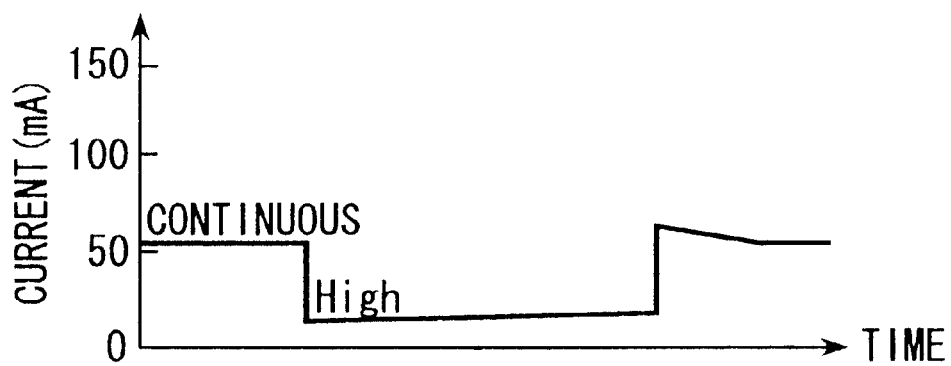
(b) INJECTION CURRENT INTO PHASE-CONTROL REGION
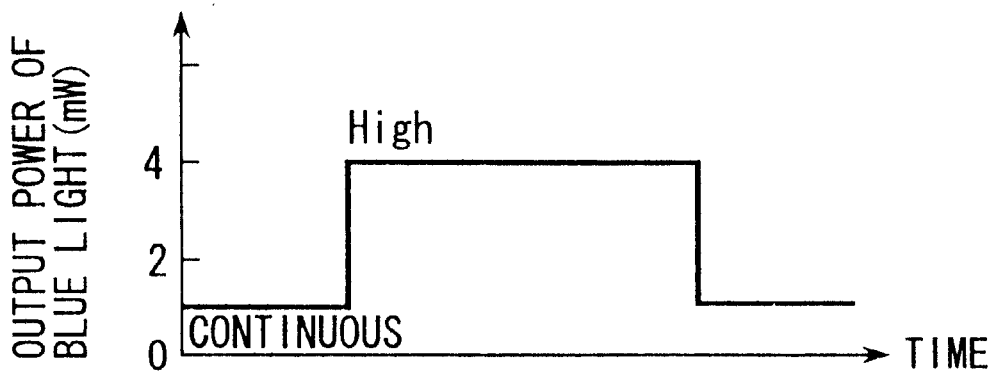
(c) OUTPUT POWER OF BLUE LIGHT FIG. 15
(a) 
(b) 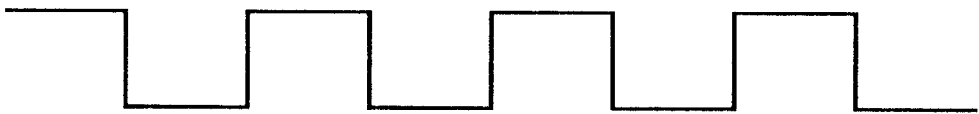
(c) 

FIG. 31
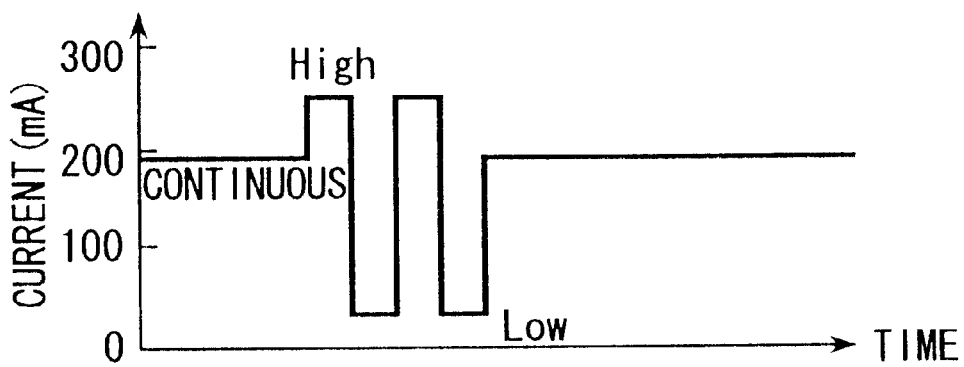
(a) INJECTION CURRENT INTO ACTIVE REGION
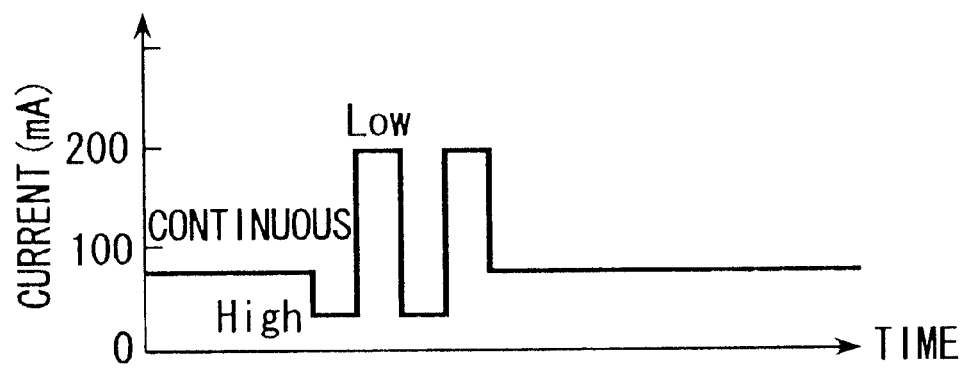
(b) INJECTION CURRENT INTO PHASE-CONTROL REGION
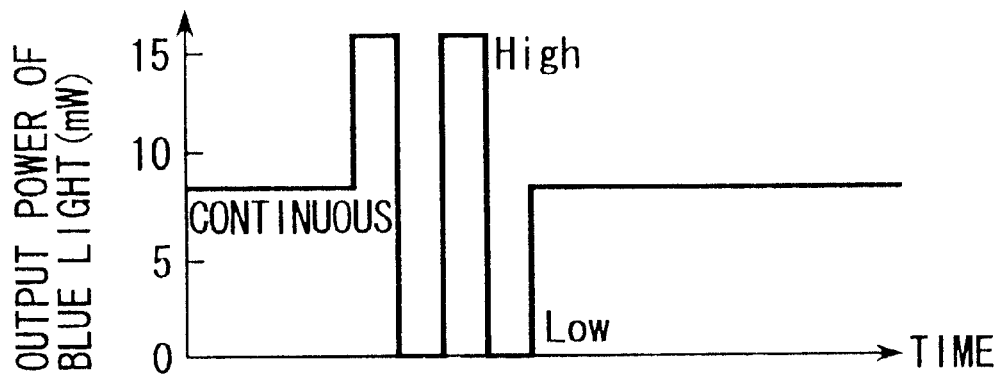
(c) OUTPUT POWER OF BLUE LIGHT

SHG LASER LIGHT SOURCE AND METHOD OF MODULATION FOR USE THEREWITH

BACKGROUND OF THE INVENTION

1. Field of Invention

This invention relates to a Second Harmonic Generation (otherwise known as "SHG") laser light source whose optical output signal can be modulated using a simple circuit and to a method of modulation for use therewith.

2. Description of the Prior Art

The surface recording density of optical disks has increased dramatically as the recording capacity of the disk has increased. This trend has led to a smaller on disk spot where the beam is focused. Accordingly, there is increased demand for the wavelength of the light source used to write and read from the disk to be as short as possible. The light sources for producing short wavelength beams include the SHG laser light source. Japanese unexamined patent application 11-26861 discloses an SHG light source which injects a fundamental wave into a nonlinear optical crystal to produce a second harmonic wave, which is a short wavelength coherent light. This type of system is shown in FIG. 1.

In FIG. 1, a distributed Bragg reflection (also known as "DBR") laser diode 1 produces a fundamental wave. An SHG device 2 is supplied with an input of the fundamental wave, converts the wavelength thereof, and outputs a second harmonic wave. An external modulator 3 is supplied with the second harmonic wave from the SHG device 2, and modulates the wave, and then outputs a modulated wave.

The FIG. 1 system operates as follows. Drive circuit 4 drives DBR laser diode 1 to output a fundamental wave which is supplied to SHG device 2, which converts the wavelength thereof, and outputs a second harmonic wave. The second harmonic wave is modulated or attenuated by external modulator 3 so that the power of the wave is controlled. As described in 11-26861, SHG device 2 has such a relationship between the output power of the second harmonic wave and the input wavelength as shown in FIG. 2. As shown in FIG. 2, the output power drastically drops once the input wavelength deviates from a specific value. Accordingly, the output power is heavily dependent on the wavelength of the fundamental wave. Also, the nature of the DBR laser diode 1 is such that the wavelength of the fundamental wave also changes when the output power thereof is changed by altering the drive current.

Consequently, even when the drive current of DBR laser diode 1 is increased to raise the power of the fundamental wave, for example, in an attempt to boost the power of SHG laser light source, the wavelength of the fundamental wave may shift. The shift would result in a drop in the output power of the SHG laser light source. Accordingly, in the prior art system, it is essential that the power of the second harmonic wave outputted by the SHG device be constant and the optical output of the SHG laser light source be changed by an external modulator 3, in order to suitably modulate the optical output. Consequently, the prior art system is always provided with an external modulator 3. The external modulator 3, in turn, requires an optical system which couples the modulator to the SHG device 2. This requirement hinders use of the prior art system as a pickup device for optical disks which is increasingly required to be smaller.

SUMMARY OF THE INVENTION

Accordingly, an object of the invention is to overcome the aforementioned and other disadvantages, deficiencies and problems of the prior art.

Another object is to provide an SHG laser light source whose optical output can be modulated using a simple mechanism without having to provide an external modulator.

A further object is to provide a method of modulation for use with the SHG laser light source.

BRIEF DESCRIPTION OF THE DRAWINGS

FIG. 12 is a graph depicting another operation of an SHG laser light source.

FIG. 13 is a graph depicting operation of a second illustrative embodiment of the invention.

FIG. 15 is a graph depicting operation of a third illustrative embodiment of the invention.

FIG. 31 is a graph depicting operation of the eighth embodiment.

DETAILED DESCRIPTION OF THE PREFERRED EMBODIMENTS

Embodiment 1

Figure 3:
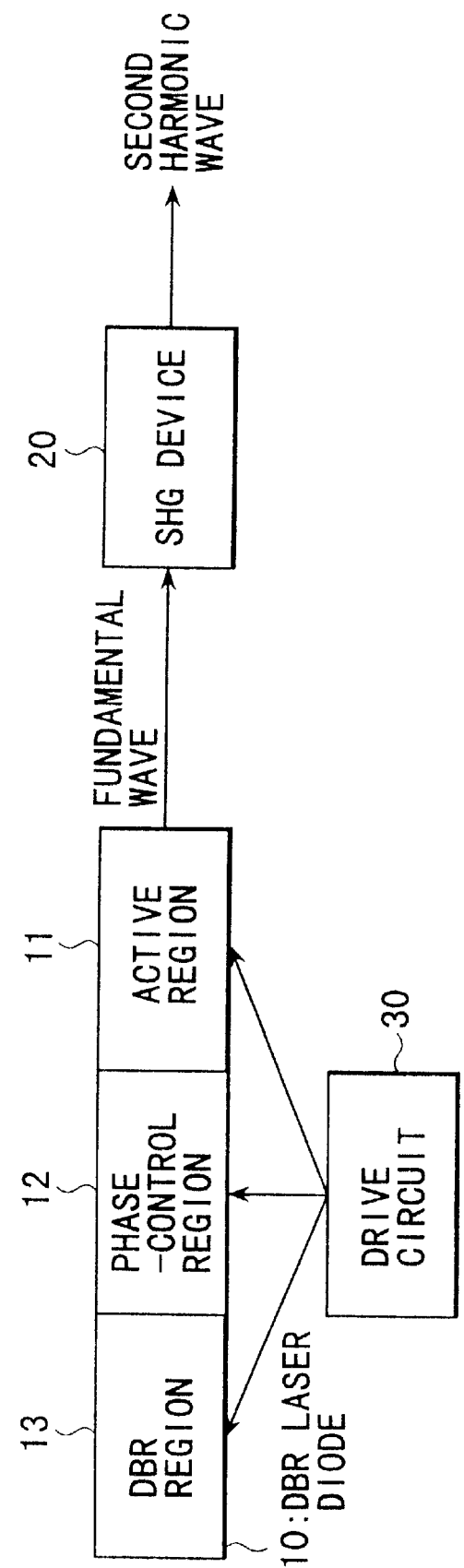
FIG. 3 is a block diagram depicting a first illustrative embodiment of the invention.

FIG. 3 shows a first illustrative embodiment of the invention comprising a DBR laser diode 10, provided with an active region 11, a phase controlled region 12, and a DBR region 13, wherein a differential grating [distributed Bragg reflector "DBR"] are formed. Each of these regions is provided with an electrode, into which electric current is supplied so that the laser diode emits a fundamental wave of light.

Active region 11 emits the fundamental wave when electric current is supplied to the region. The phase control region 12 is temperature controlled by supplying electric current to a pn junction thereof vertically or through a thin film heater. Temperature changes in the region are utilized to change the refractive index of an optical waveguide therein and control the phase of the fundamental wave within DBR laser diode 10, thus changing the wavelength of oscillation thereof. The DBR region 13 is provided an input of the fundamental wave, through phase control region 12, from active region 11. The DBR region 13 is then also temperature controlled by supplying electric current through the pn junction vertically or through a thin film heater. Temperature changes in the DBR region 13 are utilized to change the refractive index of the optical waveguide and control the reflection characteristics of the diffraction grating, thus change the wavelength of the oscillation. An example of a DBR laser diode 10 is disclosed, for example in Japan Unexamined Applications 2/65,189 and 11/112,072.

Figure 4:
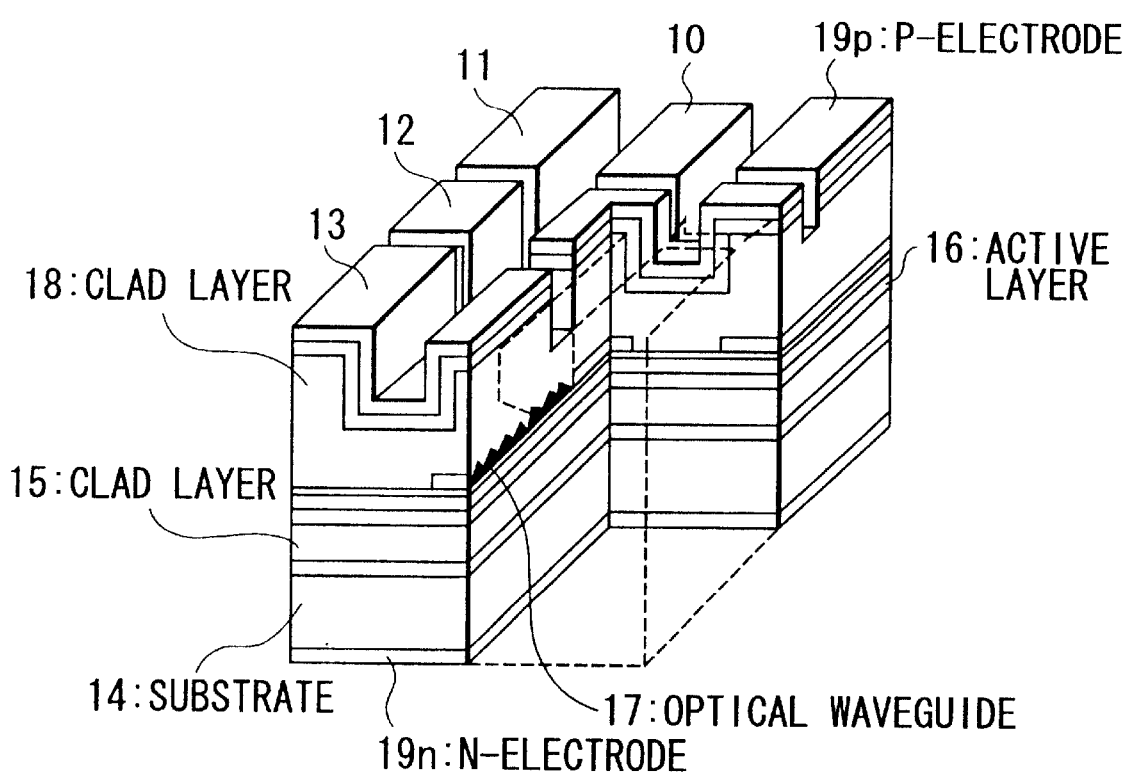
FIG. 4 is a partially cutaway perspective view depicting a specific structure of a DBR laser diode 10.

A specific structure of a DBR laser diode 10 is illustrated, for example, in FIG. 4, wherein DBR laser diode 10 is assumed to be of an AlGaAs type having a wavelength of 850 nm. An n-AlGaAs clad layer 15 is deposited on an n-GaAs substrate 14 by means of epitaxial growth using an MOCVD system to form an active layer 16 of AlGaAs. A layer of p-AlGaAs is then deposited on the active layer 16 as a waveguide layer. A rib optical waveguide 17 is formed in the laser diode using photolithography techniques.

Next, a first order diffraction grating, with an approximate interval between the gratings of 100 nm, is formed on the optical waveguide 17 by means of electron beam lithography. Silicon is injected into a DBR region 13, whereat the diffraction grating is formed, and into a phase control region 12, thereby forming the passive optical waveguide 17.

Then, second crystal growth is carried out to grow a p-AlGaAs layer as a clad layer 18. Finally, electrodes 19n and 19p, for injecting electric current, are formed on the n-type and p-type region sides of the laser diode, respectively. The p-region electrode 19p is formed so that the active region 11, phase control region 12 and DBR region 13 are electrically isolated from each other.

The three electrode, variable wavelength, AlGaAs based DBR laser diode 10 of FIG. 3 uses a drive voltage of 2.1 v and an operating current of 150 nA supplied to active region 11, thereby delivering output power of 50 mW. By supplying electric current to DBR region 13, it is possible to vary the wavelength by as much as 1.5 nm per 100 mA. Also, by simultaneously supplying electric currents to the phase control region 12 and DBR region 13 with a specific ratio, it is possible to vary the wavelength continuously.

Figure 5:
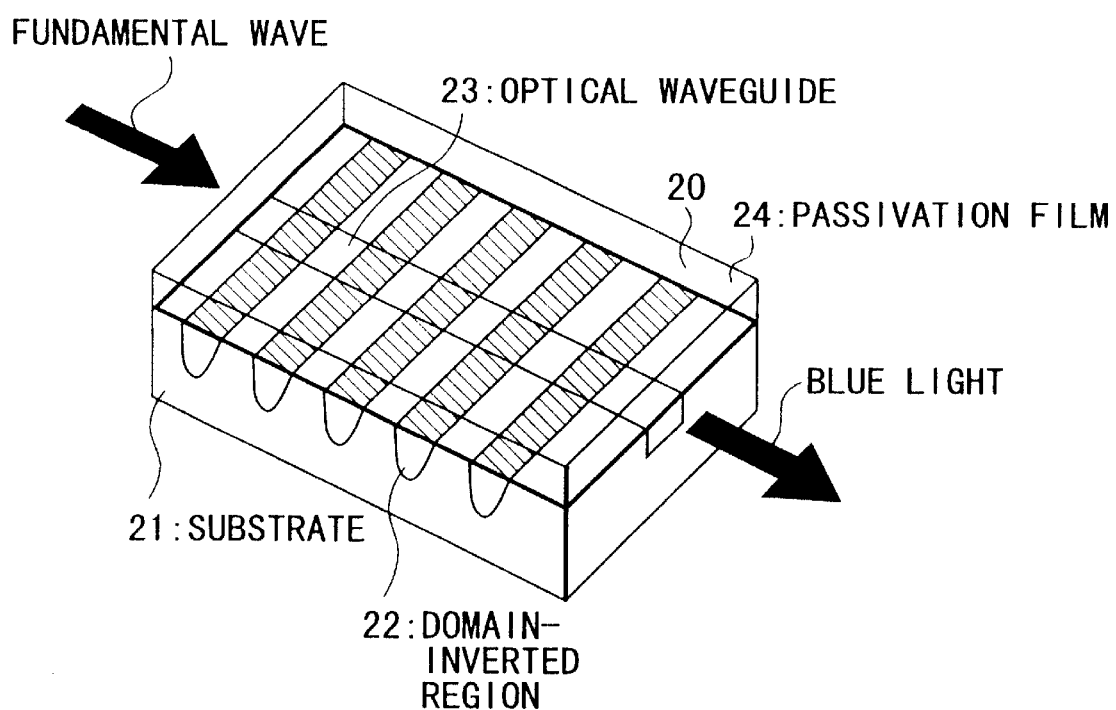
FIG. 5 is a perspective view depicting a specific structure of an SHG device 20.

The fundamental wave from DBR laser diode 10 is supplied to SHG device 20, which converts the wavelength of the fundamental wave, and emits a second harmonic wave, i.e. a blue light. A specific structure of the SHG device 20 is shown in FIG. 5, wherein the SHG device 20 is shown to comprise a comb-shaped Ta electrodes formed on an Mg: LiNbO$_3$ substrate 21. By applying an electric field to the electrodes, periodic domain inverted regions 22 are formed. For example, the periodicity is set at 3.2 µm so that phase matching takes place at a wavelength of 850 nm.

A tantalum (Ta) layer is vapor deposited and a 5 µm wide stripe is created from the layer using a photo/dry etching process, in order to form an optical waveguide 23. Proton exchange is carried out in a pyrophosphoric acid atmosphere, at 200° C. for 7 minutes, to form optical waveguide 23 by annealing, at 330° C., and for 20 minutes. After that, the Ta film is removed by wet etching. Then, an SiO$_2$ film 24 is formed to complete the fabrication of the SHG device 20.

Figure 6:
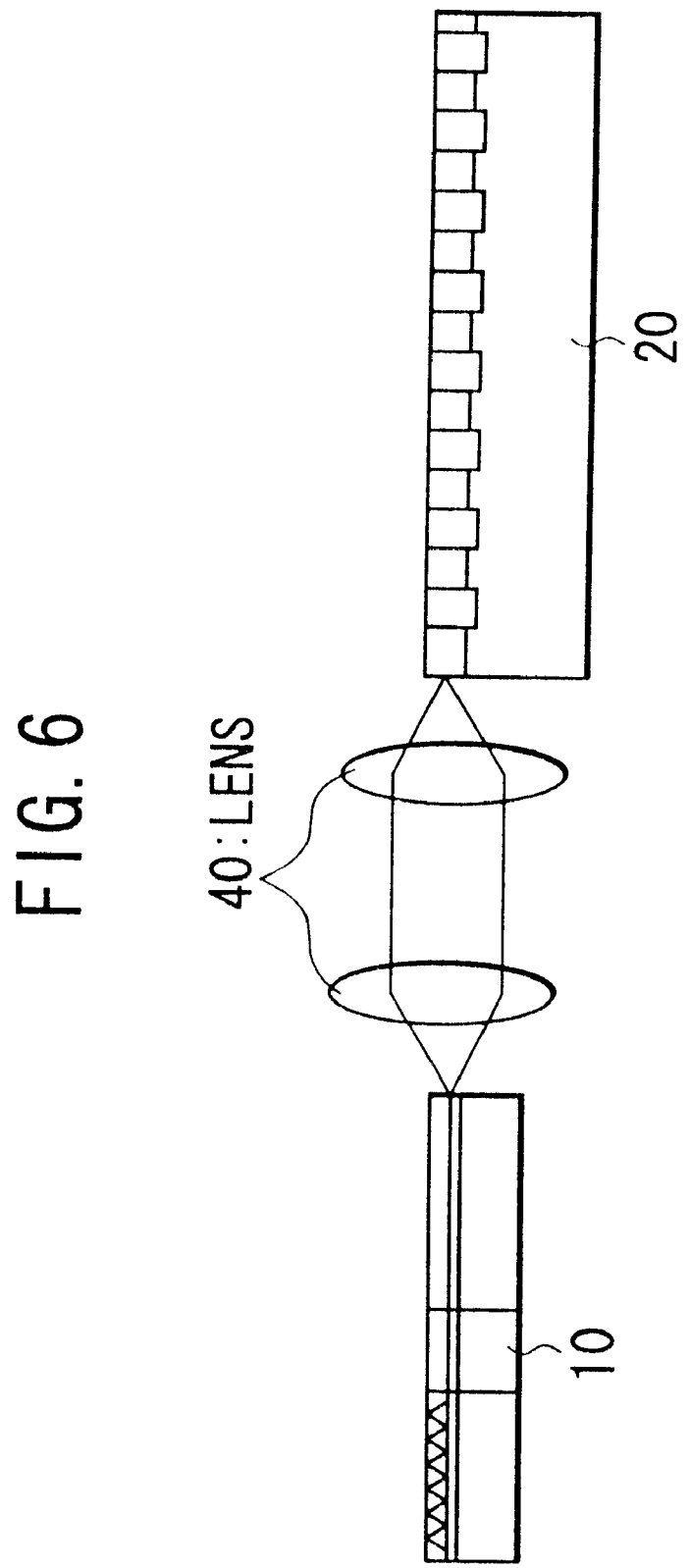
FIG. 6 is a schematic view depicting a device for coupling DBR laser diode 10 to SHG device 20.

A specific example of a coupling between DBR laser diode 10 and SHG device 20 is shown in FIG. 6, wherein light emitted by DBR laser diode 10 is focused onto the incidence end of SHG device 20 using a pair of lenses 40, and is introduced into the optical waveguide. Light having a 30 mW energy level is introduced into the optical waveguide for a laser output of 50 mW. Hence, a 4 mW wave of blue light is produced at the emission end of SHG device 20 by controlling the amount of current supplied to the DBR region 13 and matching the laser wavelength to the phase matched wavelength of the SHG device 20.

A drive circuit 30 (see FIG. 3) drives the DBR laser diode 10 so that the diode outputs a fundamental wave and simultaneously modulates electric currents supplied to the active region 11 and phase control region 12 of DBR laser diode 10. In this manner, the fundamental wave outputted by DBR laser diode 10 is modulated.

Figure 7:
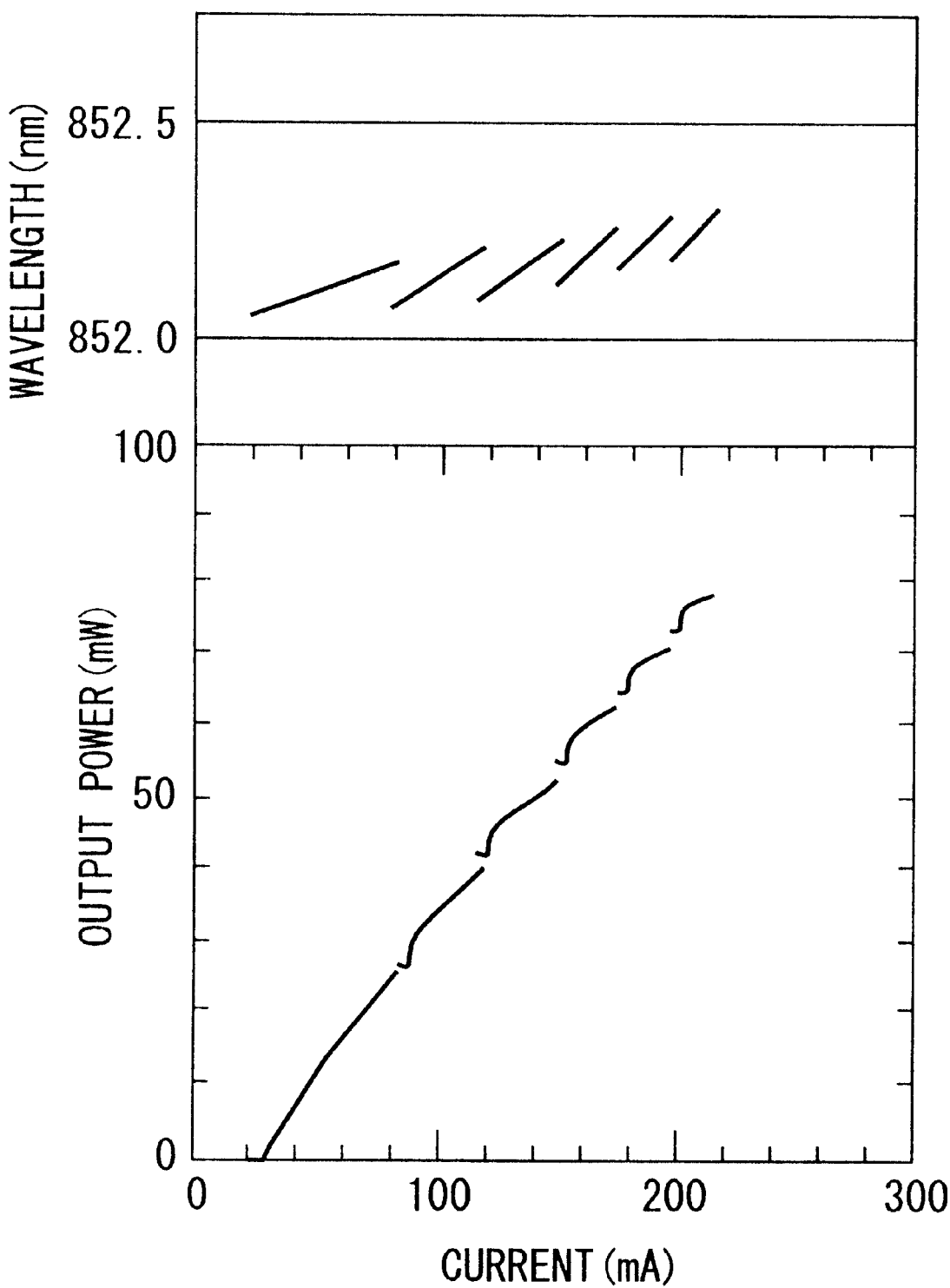
FIG. 7 is a graph depicting characteristics on an active region 11.

The operation of the embodiment is described with reference to operation of the DBR laser diode 10. Applying an electric current to active region 11 results in DBR laser diode having the characteristics shown, for example, in FIG. 7, wherein the horizontal axis represents the current, in mA, and the vertical axis represents the output power, in mW, and wavelength, in nm. The electric currents supplied to the phase control region 12 and DBR region 13 are kept constant. As shown in FIG. 7, an increase in the current causes the output power to increase and causes the wavelength of oscillation to change periodically toward the longer wavelength side.

Figure 8:
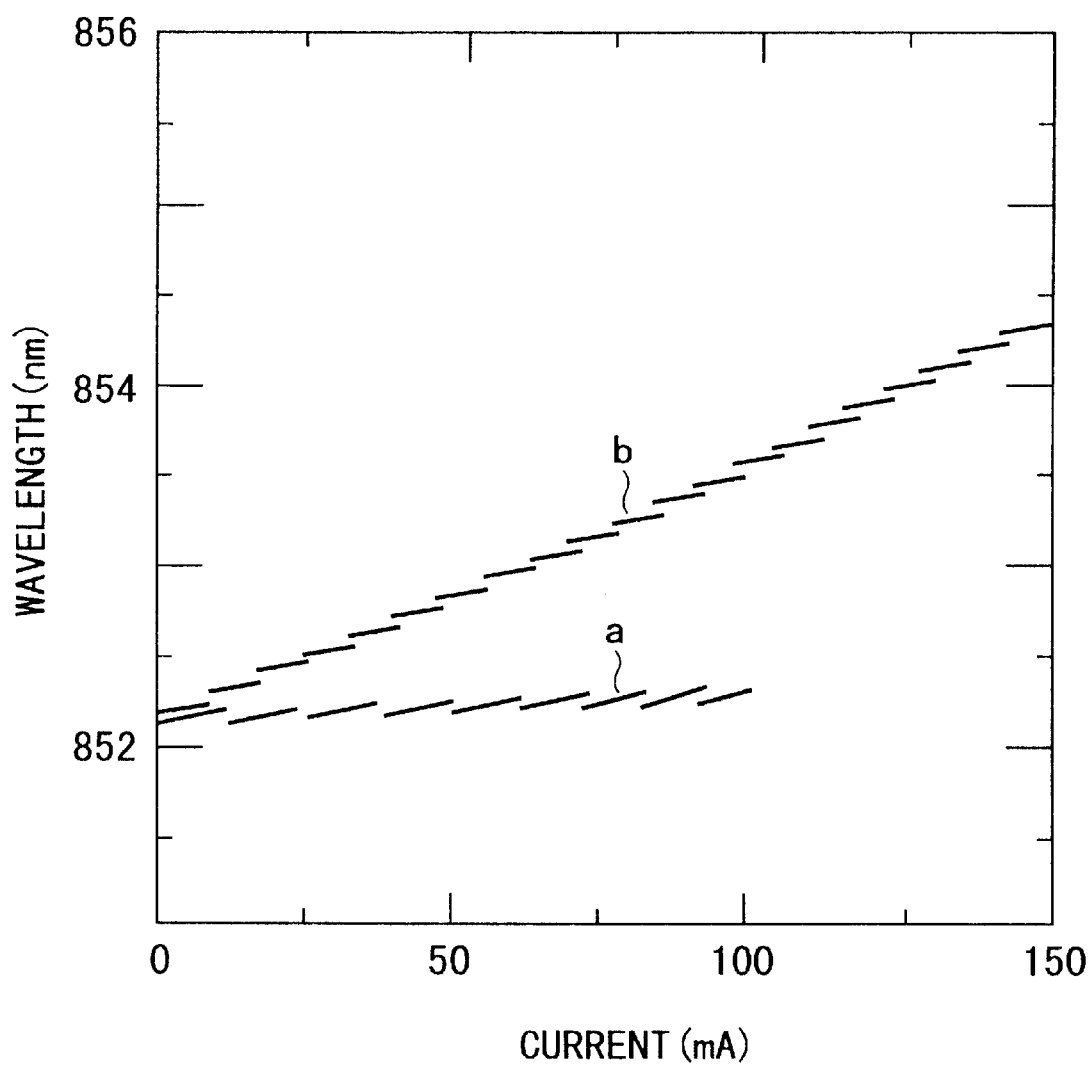
FIG. 8 is a graph depicting characteristics of a phase control region 12 and a DBR region 13.

Applying electric currents to phase control region 12 and DBR region 13, for example, will result in the characteristics shown in FIG. 8, wherein the trace indicated by "a" is when an electric current is supplied to phase control region 12, and the trace indicated by "b" is when an electric current is supplied to DBR region 13. The horizontal axis represents the current, in mA, and the vertical axis represents the wavelength, in nM. The electric current supplied to active region 11 is kept constant. On the other hand, one of the electric currents supplied to phase control region 12 and DBR region 13 is varied, while the other electric current is kept constant. As shown in FIG. 8, an increase in electric current supplied to phase control region 12 causes only the wavelength of oscillation to periodically change toward the longer wavelength side, whereas the output power is kept almost or substantially constant. Similarly, an increase in electric current supplied to DBR region 13 causes only the wavelength of oscillation to change toward the longer wavelength side, whereas the output power is kept almost or substantially constant.

The operation of the embodiment will be described with reference to the characteristics of DBR laser diode 10. Drive circuit 30 supplies electric current to the active region 11 to obtain a fundamental wave. Then, drive circuit 30 controls electric current supplied to phase control region 12 and DBR region 13 so that the wavelength of the fundamental wave agrees with the wavelength at which conversion efficiency of the SHG device 20 is optimum. The fundamental wave from the DBR laser 10 is supplied to the SHG device 20, which then outputs a light beam with a wavelength one half the wavelength of the fundamental wave, i.e. second harmonic thereof.

The output power is changed in the following manner. First, drive circuit 30 increases the electric current supplied to active region 11, thereby increasing the output power. At this point, the wavelength is also periodically changed. Accordingly, drive circuit 30 decreases the electric current supplied to phase control region 12 where the wavelength is also changed periodically as in the active region 11. The amount of decrease is adjusted so as to be almost equal to the amount of increase in active region 11. Accordingly, the total amount of electric energy supplied by drive circuit 30 to DBR laser diode 10 is kept substantially the same. This strategy permits the power output to vary without involving any change in the wavelength.

The output power is decreased by reversing the procedure just described. More specifically, drive circuit 30 decreases the electric current supplied to active region 11, thereby decreasing the output power. At the same time, drive circuit 30 increases the electric current supplied to phase control region 12 to suppress any change in the wavelength of the fundamental wave. The drive circuit 30 is able to simultaneously vary the electric currents supplied to active region 11 and to phase control region 12, thus changing the output power of the fundamental wave and suppressing any change in the wavelength thereof at the same time.

Figure 1:
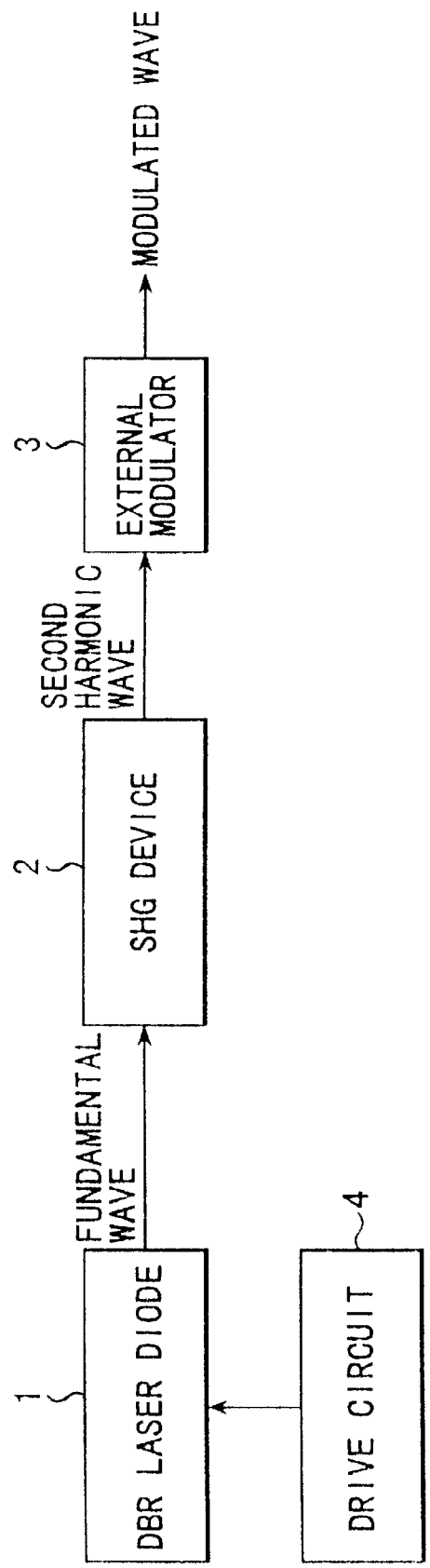
FIG. 1 is a block diagram depicting a prior art SHG laser light source.
Figure 2:
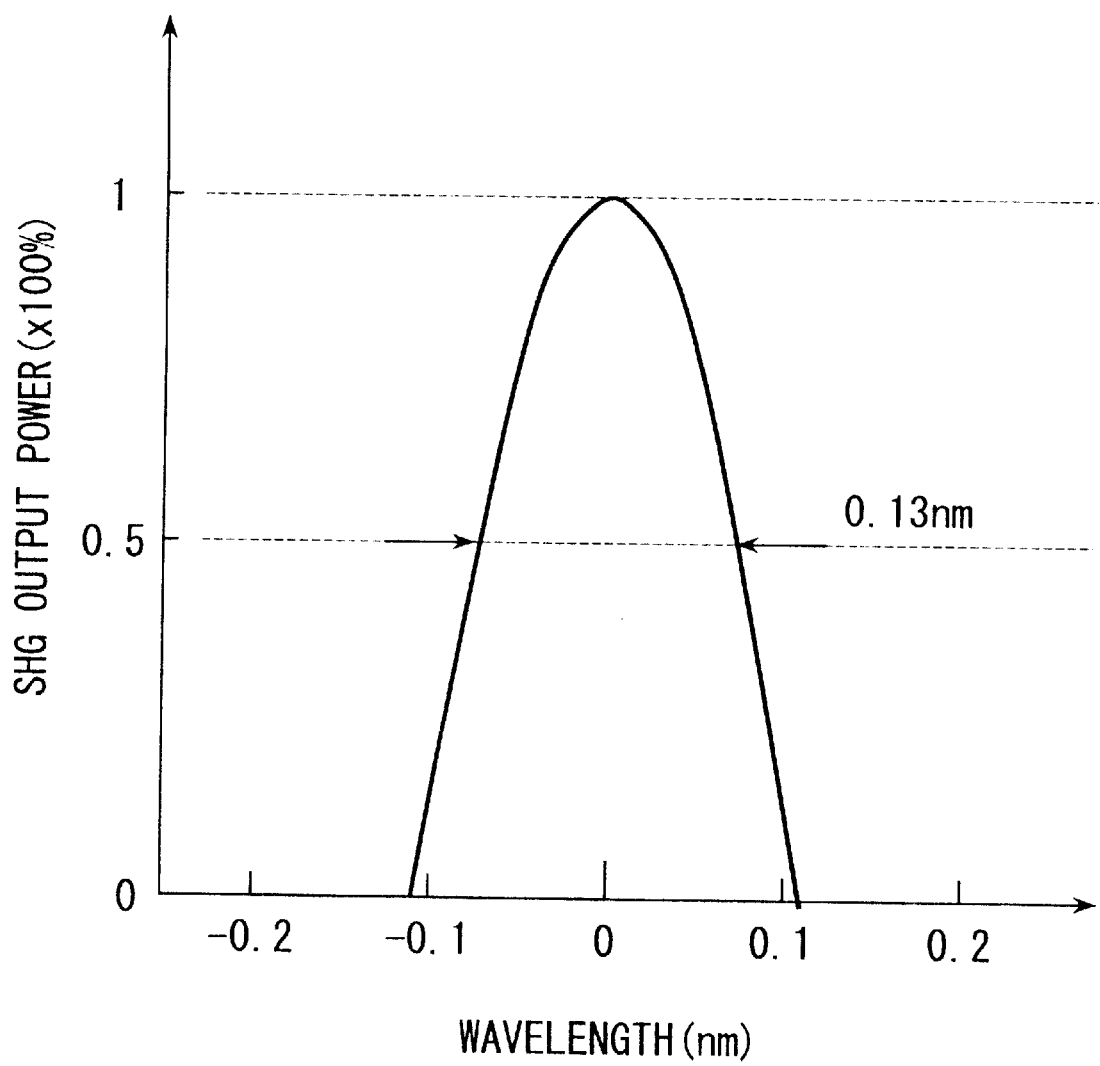
FIG. 2 is a graph depicting characteristics of an SHG device.

Thus, with the invention, it is possible to suppress effects due to heavy dependence of the characteristics of SHG device 20, shown in FIG. 2, upon the wavelength. Thus, advantageously, the invention system has monotone characteristics in which the output power of the SHG laser light source simply increases as the output power of the fundamental wave is increased. Thus, it is possible with the invention to directly modulate the second harmonic wave by means of the electric current supplied to DBR laser diode 10. Accordingly, with the invention, advantageously, there is no need for any external modulator to be used with the SHG laser light source. Hence, with the invention, advantageously, an SHG laser light source having a simplified structure is provided.

Figure 9:
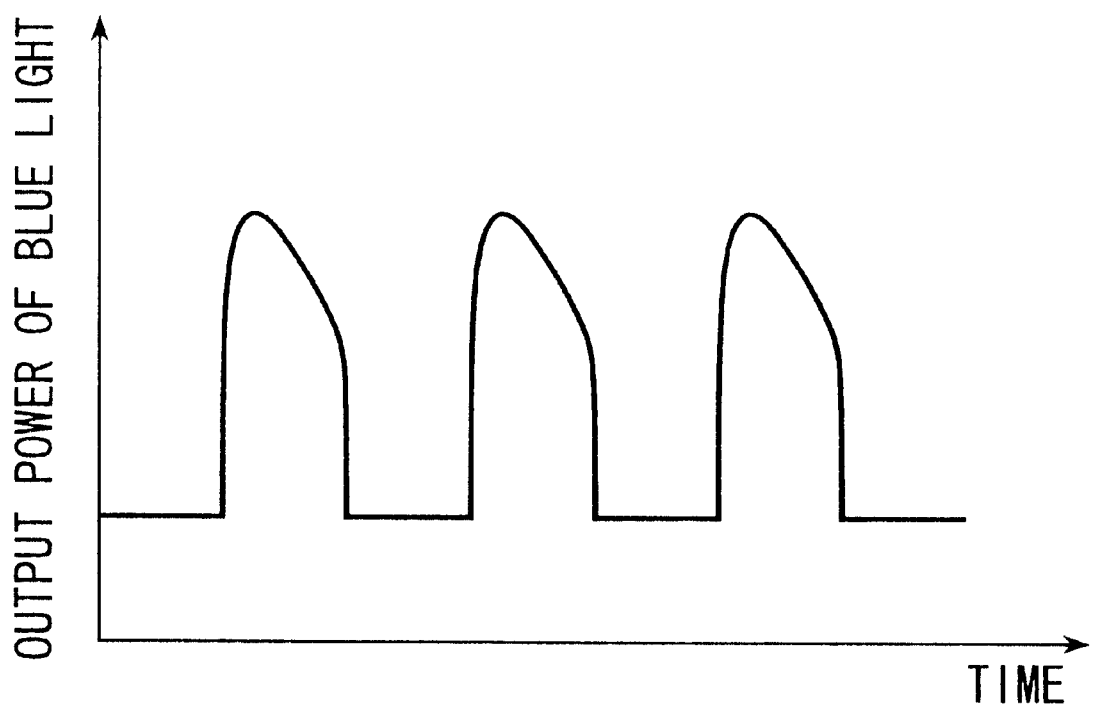
FIG. 9 is a graph depicting characteristics of an output power of blue light provided by an SHG laser light source.

The operation of the invention will be further discussed from a thermodynamic viewpoint and referring to wavelength shifts in DBR laser diode 10. When an electric current is supplied to active region 11, energy that is not changed into light is transformed into heat. This causes the chip temperature of the laser diode 10 to increase. This also results in a temperature increase in active region 11, phase control region 12 and DBR region 13. The temperature increase in active region 11 or phase control region 12 causes the refractive index of active layer 16 to be changed, thereby changing the effective resonant wavelength thereof. Accordingly, the condition of the optical phase is changed, thereby resulting in a change in the wavelength of oscillation. Thus, when an electric current supplied to active region 11 is modulated to be a rectangular waveform, the resulting second harmonic wave, of blue light, is shaped into a form which is far different from the rectangular waveform, as shown in FIG. 9.

The amount of heat produced in active region 11 is represented as follows:

$$I1 \times V1 - P \tag{1}$$

wherein: I1 is the amount of electric current, in mA, supplied to active region 11; V1 is the operating voltage, in V, of active region 11; and P is the laser output, in NW. This amount of heat can be compensated by phase control region 12 to keep constant the chip temperature of the laser diode 10.

More specifically, the electric current supplied to phase control region 12 is increased when the electric current supplied to active region 11 is low. Conversely, the electric current supplied to phase control region 12 is decreased when the electric current supplied to active region 11 is high. In other words, it is possible to keep the wavelength of oscillation constant by modulating the electric currents so that below equation (2) always holds true:

$$I1 \times V1 + I2 \times V2 - P = \text{constant}. \tag{2}$$

wherein I2 is the amount of electric current, in mA, supplied to phase control region 12, and V2 is the operating voltage, in volts, of phase control region 12. The other symbols are defined in connection with equation (1).

Figure 10:
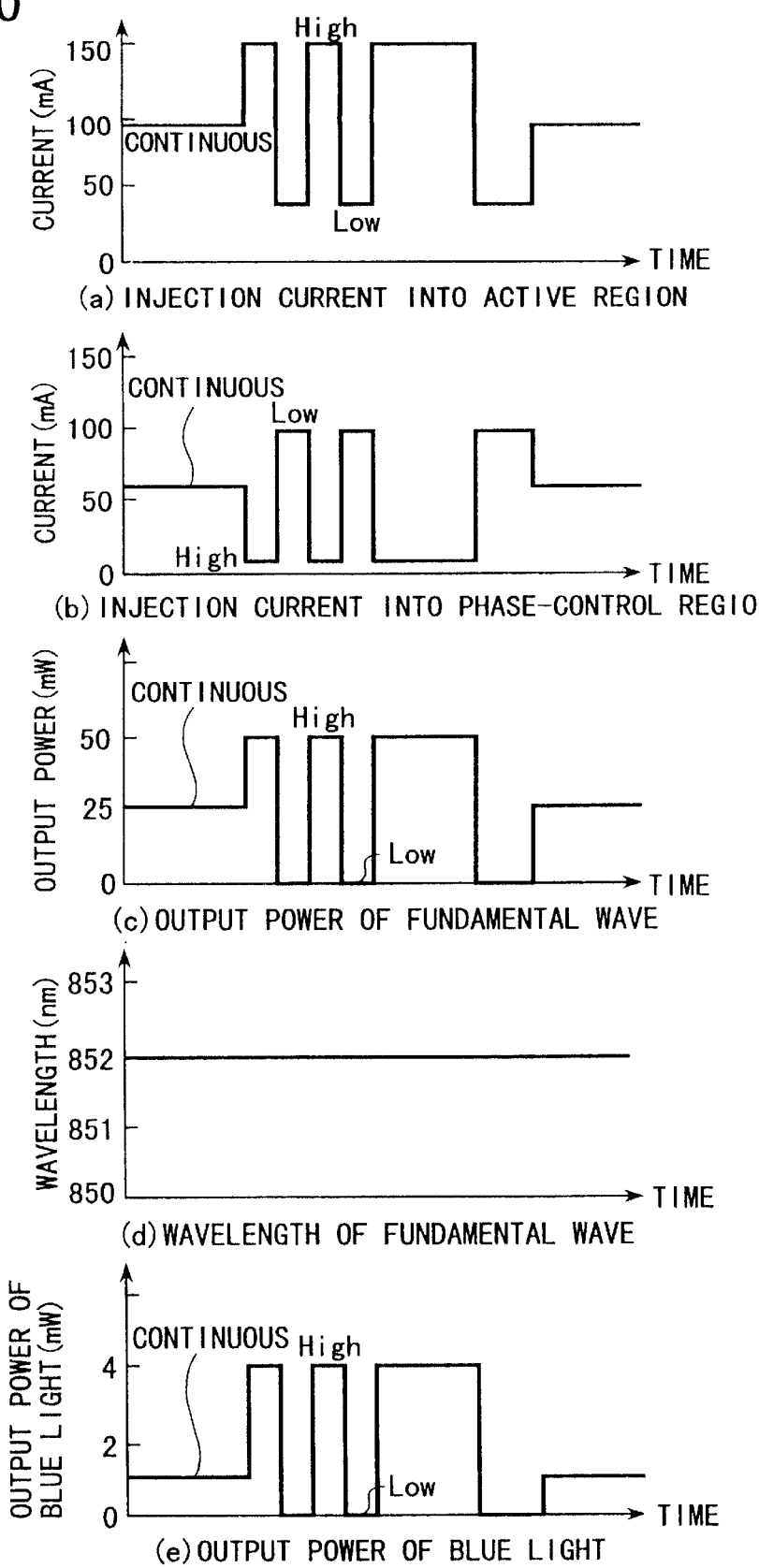
FIG. 10 is a graph depicting operation of the first illustrative embodiment of the invention.

FIG. 10 is a graph for explaining operation of the SHG laser light source, wherein, (a) represents electric current supplied to active region 11; (b) represents electric current supplied to phase control region 12; (c) represents output power of the fundamental wave outputted by DBR laser diode 10; (d) represents the wavelength of oscillation provided by DBR laser diode 10; and (e) represents output power of blue light after waveform conversion.

The oscillation threshold of DBR laser diode 10 is 40 mA. At the start of operation, a constant current of 95 mA, which is 25 mW, is supplied to active region 11 by drive circuit 30 (see FIG. 3). Then, transition is made to a modulation mode. In the modulation mode, a high state level is set at 150 mA, 50 mW, and a low state level is set to 40 mA, 0 mW. Thus, the amount of heat produced at each level of current is as follows:

Constant current level:

$$I1 \times V1 - P = 95 \text{ mA} \times 2.1 \text{ V} - 25 \text{ mW} = 175 \text{ mW}$$

High state level:

$$I1 \times V1 - P = 150 \text{ mA} \times 2.1 \text{ v} - 50 \text{ mW} = 265 \text{ mW}$$

Low state level:

$$I1 \times V1 - P = 40 \text{ mA} \times 2.1 \text{ v} - 0 \text{ mW} = 84 \text{ mW}$$

Thus, the difference in the amount of heat is 90 mW for the high state level and 91 mW for the low state level, when compared with the constant current level.

On the other hand, the electric current supplied by drive circuit 30 to phase control region 12 is set so as to compensate the amount of heat produced in active region 11. At the start, a constant current of 57 mA is supplied to phase control region 12. Then, transition is made to a modulation mode. In the modulation mode, electric current is set to 15 mA when a modulating current supplied to active region 11 is set at a high state level, or to 100 mA when the modulating current is set at a low state level. Thus, the amount of heat produced at each level of current is as follows:

Constant current level:

$$I2 \times V2 = 57 \text{ mA} \times 2.1 \text{ v} = 120 \text{ mW}$$

High state level:

$$I2 \times V2 = 15 \text{ mA} \times 2.1 \text{ v} = 31.5 \text{ mW}$$

Low state level:

$$I2 \times V2 = 100 \text{ mA} \times 2.1 \text{ v} = 210 \text{ mW}$$

This results in the following amounts of heat being produced in the DBR laser diode 10 at each level of current.

Constant current level:

$$I1 \times V1 + I2 \times V2 - P = 295 \text{ mW}$$

High state level:

$$I1 \times V1 + I2 \times V2 - P = 296.5 \text{ mW}$$

Low state level:

$$I1 \times V1 + I2 \times V2 - P = 294 \text{ mW}$$

Accordingly, the sum of the amounts of heat produced in active region 11 and phase control region 12 remain basically the same even in the modulation mode. As shown in graph (d) of FIG. 10, it is possible to maintain the wavelength of oscillation of the fundamental wave to be substantially equal in both the constant current mode and the modulation mode. For characteristics regarding the output power of blue light, it is also possible to obtain a stable rectangular wave with a peak output power of 4 mW, as shown in graph (e) of FIG. 10. Hence, the embodiment provides a stable modulated waveform.

As discussed, electric currents supplied to active region 11 and phase control region 12, are controlled by drive circuit 30 in such a manner that the value of "I1×V1+I2×V2−P" is kept almost or substantially constant. The control method enables the fundamental wave of the DBR laser diode 10 to be modulated with the oscillation wavelength thereof kept constant. Hence, the blue light provided by the SHG device 20 is consistently intensity modulated.

Embodiment 2

When a chip comprising a DBR laser diode 10 is mounted so that the active layer 16 thereof is faced upward (referenced as to a junction upward mounting), heat produced in active region 11 or phase control region 12 is transferred to DBR region 13 because a GaAs substrate 14 is as thick as 100 to 200 μm (see FIG. 4).

Figure 11:
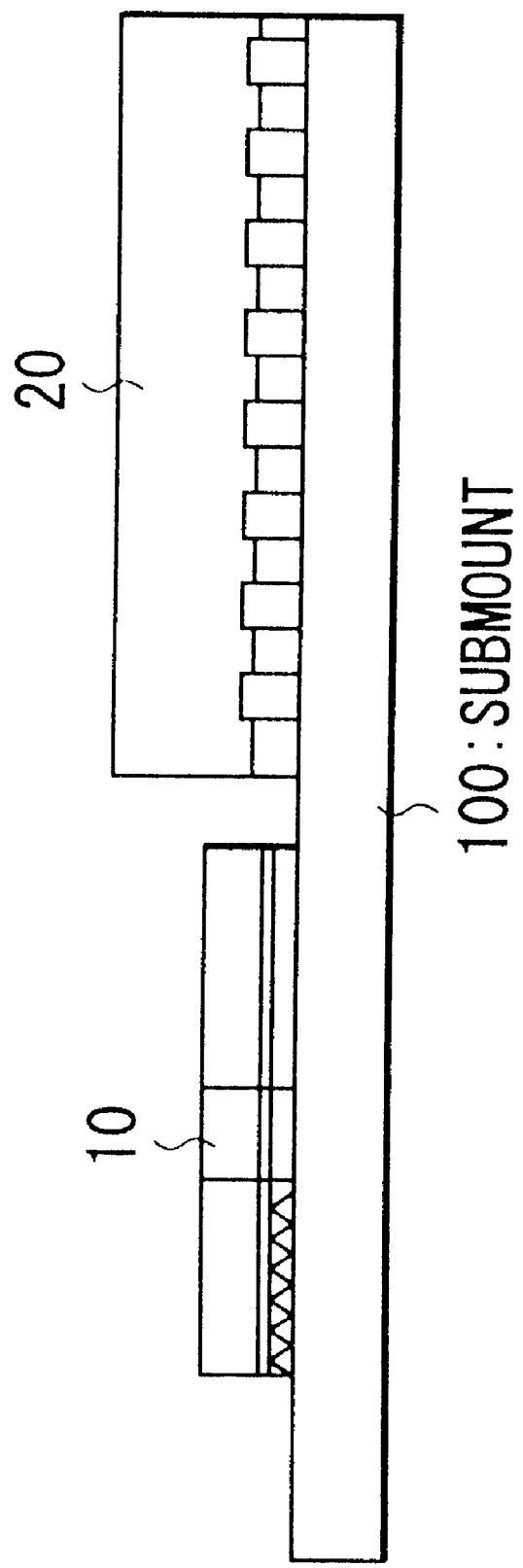
FIG. 11 is a schematic view depicting another specific way of coupling DBR laser diode 10 and SHG device 20.

In contrast, when the chip is mounted so that active layer 16 comes into contact with the submount 100 (referenced as to a junction downward mounting), as shown in FIG. 11, a majority of heat produced in active region 11 will be transferred to submount 100. Accordingly, heat transferred from phase control region 12 to DBR region 13 becomes more influential than heat transferred from active region 11. Thus, even if electric currents supplied to active region 11 and phase control region 12 are controlled so that the value "I1×V1+I2×V2−P" is kept constant, the temperature of DBR region 13 will vary depending on the condition or type of mounting. Hence, the system may fail to provide a stable modulated waveform.

In the case where each sum of the amounts of heat produced in individual regions is kept constant, a constant current of 95 mA, and 25 mW, is supplied to active region 11 at the start. Then, transition is made to a modulation mode. In this case, modulation is carried out at high speed, compared with the speed of heat transfer, by using a rectangular wave whose frequency is as high as 20 MHz. Hence, a change in the amount of heat transferred to DBR region 13 is comparatively small. Thus, the amount of waveform shift due to temperature change in the DBR region 13 is also small.

In contrast, a change in the amount of heat transferred to DBR region 13 is comparatively large in a domain where the period of modulation is long. Hence, the frequency is low, and the amount of waveform shift due to temperature change in DBR region 13 is large.

The second embodiment is described with reference to FIG. 12, wherein (a) represents electric current supplied to active region 11; (b) represents electric current supplied to phase control region 12; and (c) represents output power of blue light.

Active region 11 is supplied a constant current of 95 mA and 25 mW at the start. Then, active region 11 is made to output pulses having a width of 1 ms. In the pulse output mode, a current of 150 mA and 50 mW is supplied. Hence, the amount of heat produced at each level of current is as follows:

Constant current level:

$$I1 \times V1 - P = 95 \text{ mA} \times 2.1 \text{ v} - 25 \text{ mW} = 175 \text{ mW}$$

High state level:

$$I1 \times V1 - P = 150 \text{ mA} \times 2.1 \text{ v} - 50 \text{ mW} = 265 \text{ mW}.$$

Thus, the difference in the amount of heat between the high state level and the constant current level is 90 mW.

On the other hand, the electric current supplied to phase control region 12 is set so as to compensate the amount of heat produced in active region 11. At the start, a constant current of 57 mA is supplied to phase control region 12. Then, transition is made to a pulse output mode. In the pulse output mode, the modulating current supplied to photo control region 12 is set at 15 mA. Hence, the amount of heat produced at each level of current is as follows:

Constant current level:

$$I2 \times V2 = 57 \text{ mA} \times 2.1 \text{ v} = 120 \text{ mW}$$

High state level:

$$I2 \times V2 = 15 \text{ mA} \times 2.1 \text{ v} = 31.5 \text{ mW}$$

Accordingly, the following amounts of heat are produced in DBR laser diode 10 at each level of current.

Constant current level:

$$I1 \times V1 + I2 \times V2 - P = 295 \text{ mW}$$

High State level:

$$I1 \times V1 + I2 \times V2 - P = 296.5 \text{ mW}.$$

Accordingly, the sum of the amounts of heat produced in active region 11 and phase control region 12 remains basically the same even in the modulation mode.

As shown in graph (c) of FIG. 12, the oscillation wavelength of the fundamental wave is shifted and hence the output power of blue light is changed, when the electric current supplied to DBR region 13 is kept constant. This is because the amount of heat transferred to DBR region 13 is changed for pulses having a large width, such as 1 ms, which causes the refractive index of the diffraction grating to also change. This results in the shift of the wavelength of oscillation.

Accordingly, drive circuit 30 of FIG. 3 controls the amount of electric current supplied to phase control region 12 so that the sum of the amounts of heat transferred from active region 11 to DBR region and from phase control region 12 to DBR region is remains almost or substantially constant.

The operation of the embodiment will be described with reference to FIG. 13, wherein (a) represents electric current supplied to active region 11, (b) represents electric current supplied to phase control region 12, and (c) represents the output power of the blue light.

Drive circuit 30 outputs pulses having a width of 1 ms to active region 11, as shown in (a) of FIG. 13. At the same time, drive circuit 30 changes the electric current supplied to phase control region so that current is increased with time, as shown in (b) of FIG. 13. This keeps the wavelength of oscillation constant. Hence, a stable rectangular wave of blue light with a peak output power of 4 mW is generated by the SHG device 20, as shown in (c) of FIG. 13.

As discussed, it is possible with the invention to change the output power of the fundamental wave and at the same time suppress a change in the wavelength thereof, by allowing drive circuit 30 to control the amount of electric current supplied to phase control region 12 so that the sum of amounts of heat transferred from active region 11 to DBR region 13 and from phase control region 12 to DBR region 13 remains almost or substantially constant. Thus, advantageously, with the invention, there is no need to include any external modulator in the SHG laser light source. Accordingly, with the invention, a simple laser light source is provided.

EXAMPLE 3

Figure 14:
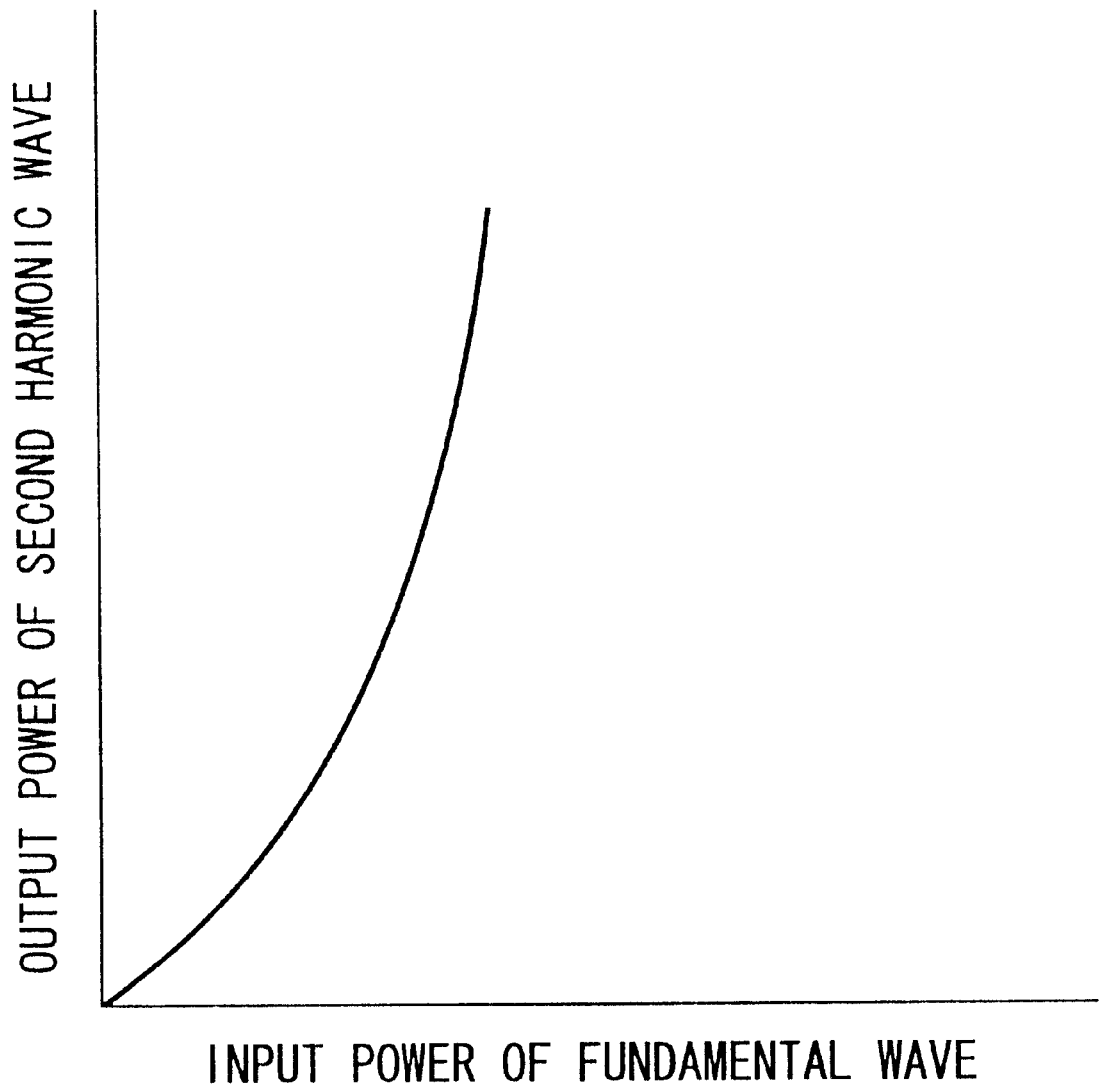
FIG. 14 is a graph depicting characteristics of SHG device 20.

The third illustrative embodiment will now be described with reference to the characteristics of SHG device 20, shown in FIG. 14, wherein the horizontal axis represents the input power of the fundamental wave supplied to SHG device 20, and the vertical axis represents the output power of the second harmonic wave, generated by the SHG device. As shown in FIG. 14, the output power of the second harmonic wave is proportional to the square of the input power of the fundamental wave. Therefore, the square law characteristics must be taken into account in order to derive the desired output power from the second harmonic wave by varying the output power of the fundamental wave. Also, since the characteristics differ from one type of SHG device 20 to another, the characteristics must be measured priorly and the output power of the fundamental wave must be changed according to the measured characteristics. Hence, the prior art SHG laser light source is provided with an external modulator to modulate the output power, which has various disadvantages as priorly discussed.

Accordingly, in the invention, advantageously, drive circuit 30 shown in FIG. 3 supplies an electric current for modulation (e.g. pulse width modulation or pulse count modulation) to active region 11, according to the desired output power of the second harmonic wave.

The overall operation of the invention system is described with reference to FIG. 15, which shows the output waveforms of electric current supplied by drive circuit 30 to active region 11, and wherein (a) represents a waveform having a 100% duty cycle; (b) represents a waveform having a 50% duty cycle; and (c) represents a waveform having a 10% duty cycle.

Drive circuit 30 supplies active region 11 with an electric current having a 100% duty cycle, as shown by line (a) of FIG. 15, in order to provide the output power of the fundamental wave. Then, drive circuit 30 controls electric currents supplied to phase control region 12 and DBR region 13 so that the wavelength of the fundamental wave agrees with the wavelength at which conversion efficiency of the SHG device 20 is optimum. The described fundamental wave is supplied to SHG device 20 which then outputs a light beam with a wavelength which is one half the wavelength of the fundamental wave, i.e. second harmonic wave. The output power of the second harmonic wave at this point is defined as being 100%.

In order to obtain a 50% output power of the second harmonic wave, drive circuit 30 supplies active region 11 with a pulse width modulate current having a 50% duty cycle, without changing the maximum value of the current, as shown by line (b) of FIG. 15.

Similarly, in order to obtain a 10% output power of the second harmonic wave, drive circuit 30 supplies active region 11 with a pulse width modulated current having a 10% duty cycle, and without changing the maximum value of the current, as shown in line (c) of FIG. 15.

Although the third embodiment shows the case where control of the duty cycle by drive circuit 30 is based on pulse width modulation, the embodiment may also use pulse count modulation wherein the pulse width is constant and the number of pulses per unit time is changed. Also, the pulse modulation may be based on a combination of pulse width modulation and pulse count modulation.

Advantageously, the output power of the second harmonic wave can be easily controlled by directly pulse modulating the electric current or voltage supplied to DBR laser diode 10. Thus, advantageously, with the invention, it is possible to linearly control the output power of the second harmonic wave without having to consider the square law characteristics of the SHG device 20. Accordingly, with the invention, advantageously, there is no need for an external modulator in the SHG laser light source, and furthermore, advantageously, the invention is therefore simple in structure and circuitry.

Alternatively, drive circuit 30 may cause an electric current supplied by drive circuit 30 to phase control region 12 to be pulse modulated at the same time in order to eliminate change in the wavelength of the fundamental wave provided by $_D$BR laser diode 10, when an electric current supplied by drive circuit 30 to active region 11 is pulse modulated. The electric current supplied to phase control region 12 is increased when electric current supplied to active region 11 is decreased, and vice versa, as discussed.

In the third embodiment, only the case of drive circuit 30 controlling DBR laser diode 10 using the electric current is described. However, since the electrical characteristics of DBR laser diode 10 are basically the same as those of a regular diode, the voltage of DBR laser diode 10 is varied when the current thereof is varied. Hence, it may be considered that drive circuit 30 controls DBR laser diode 10 by means of a voltage.

Embodiment 4

Figure 16:
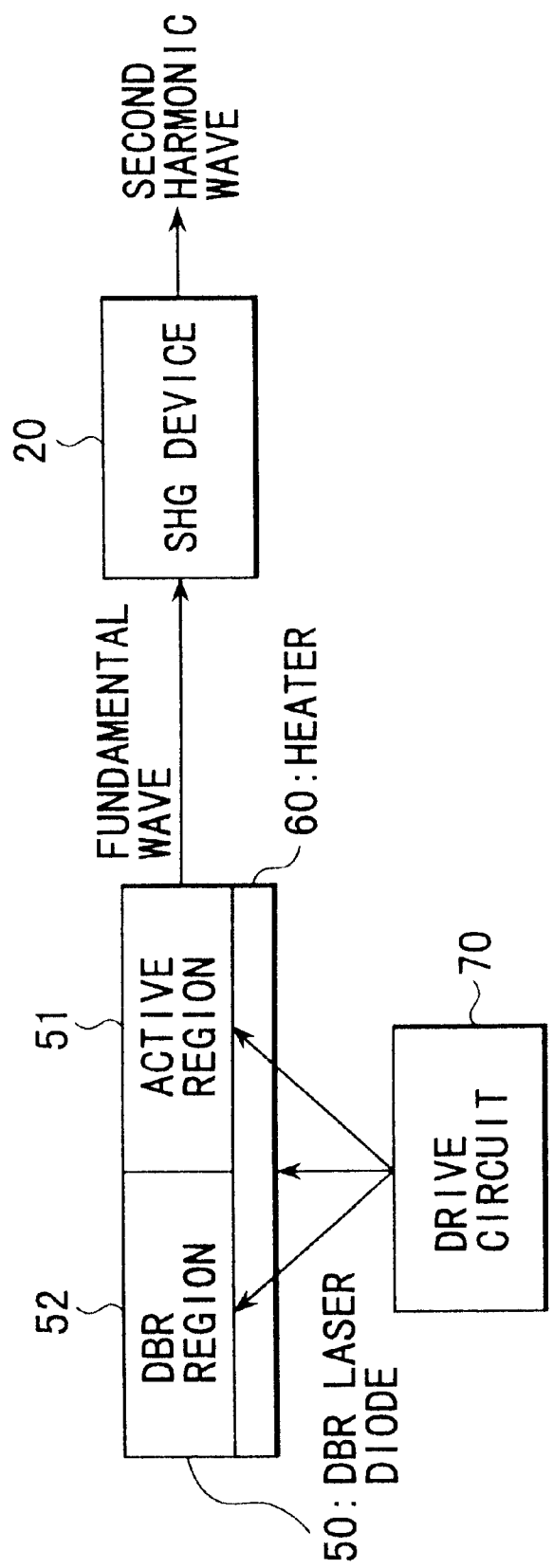
FIG. 16 is a block diagram depicting a fourth illustrative embodiment of the invention.

An SHG laser light source using a two electrode DBR laser diode (as contrasted with a three electrode DBR laser diode, as shown in FIG. 3) is discussed with reference to FIG. 16, wherein elements identical to those shown in FIG. 3 have the same symbols and are not further described hereat for sake of clarity of description. In FIG. 16, DBR laser diode 50 is provided with an active region 51 and a DBR region 52 wherein diffraction gratings are formed. Each of these regions is provided with an electrode, to which electric current is supplied so that the laser diode is caused to emit a fundamental wave. Active region 51 emits the fundamental wave when electric current is supplied to the region. The fundamental wave from active region 51 is supplied to SHG device 20. The DBR region 52 is temperature controlled by supplying an electric current through the pn junction thereof vertically or through a thin film heater. Temperature changes in the region are utilized to change the refractive index of an optical waveguide and control the reflection characteristics of the diffraction grating, thereby causing change of the wavelength of oscillation.

Figure 17:
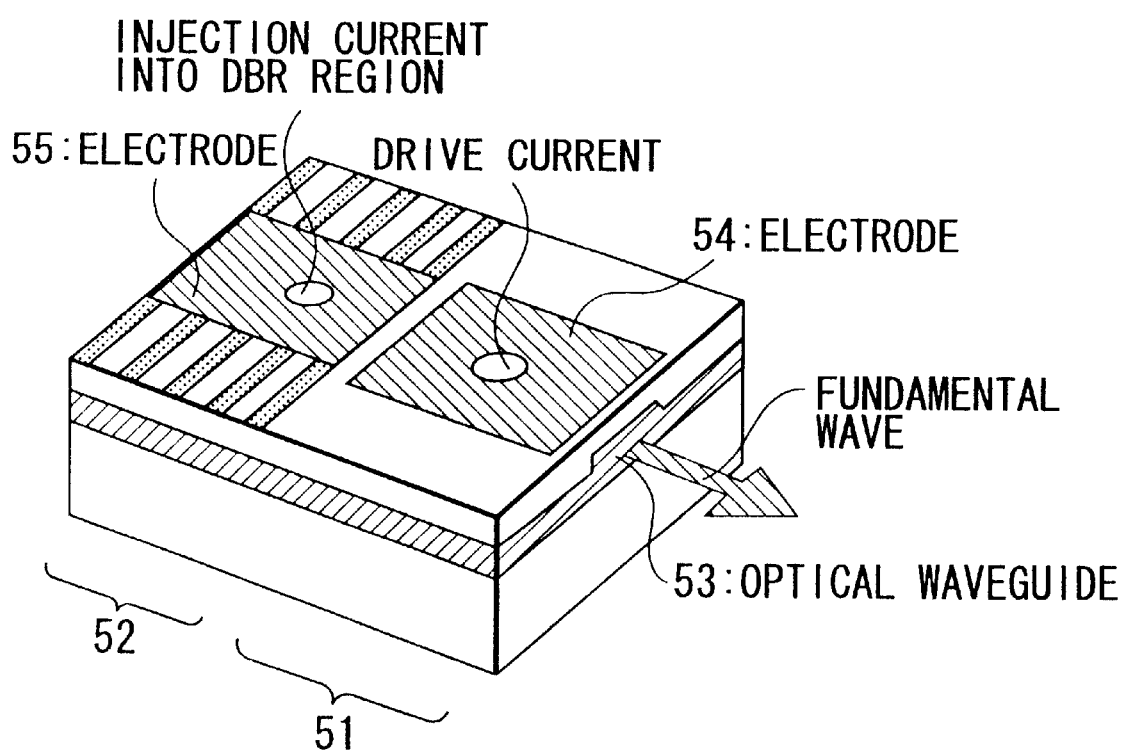
FIG. 17 is a perspective view depicting a specific structure of DBR laser diode 50.

An example of a DBR laser diode 50 is illustrated in FIG. 17, wherein DBR laser diode 50 is assumed to be of an AlGaAs type having an output of wavelength of 850 nm. DBR diode 50 is fabricated in basically the same way as the three electrode AlGaAs type DBR laser diode shown in FIG. 4. An n-AlGaAs layer is deposited on an n-GaAs substrate by epitaxial growth using an MOCVD system. Then, an active layer of AlGaAs is formed. A layer of p-AlGaAs is further deposited as an optical waveguide layer. A rib optical waveguide 53 is formed in the laser diode by photolithography techniques.

Next, a first order diffraction grating, having an approximate interval between the gratings of 100 nm, is formed on the optical waveguide 53 by electron beam lithography. Similar to the three electrode AlGaAs type DBR laser diode of FIG. 4, silicon is injected into DBR region 52 only where the diffraction grating is formed, thus forming a passive optical waveguide 53.

A second crystal growth is carried out to grow a p-AlGaAs layer which acts as a clad layer. Finally, electrodes for supplying electric current are formed on the n-type and p-type region sides of the laser diode, respectively. The p-region electrode 54,55 are formed so that active region 51 and DBR region 52 are electrically isolated from each other.

The two electrode, variable wavelength, AlGaAs DBR laser diode 50 of FIGS. 16, 17 has a drive voltage of 2.1 volts applied thereto and an operating current of 150 mA applied to active region 51 thereof, and delivers an output power of 50 mW. By supplying an electric current to DBR region 52, it is possible to vary the wavelength by as much as 1.5 nm per 100 mA. Where there is no phase control region, the characteristics of the variable wavelength DBR laser diode 50 are such that the wavelength thereof is varied with mode hopping at Fabry-Perot mode intervals, which is approximately 0.1 nm.

Similar to the three electrode DBR laser diode of FIGS. 3, 4, when an electric current is supplied to active region 51, energy that is not changed into light is transformed into heat, which causes the chip temperature of laser diode 50 to rise. This also results in a temperature increase in active region 51 and DBR region 52. The temperature increase in active region 51 causes the condition of optical phase to change. A temperature change in DBR region 52 causes increase in the refractive index of the diffraction grating in DBR region 52. Hence, the wavelength of oscillation is caused to shift toward the longer wavelength side.

A specific exemplary structure of a DBR laser diode 50 is described with reference to FIG. 18, wherein a heater 60 is formed of platinum and supplies heat to DBR laser diode 50 which comprises active region 51 and DBR region 52. The platinum heater 60 is formed on a Silicon submount 100. On top of platinum heater 60, is formed an isolation layer 61, On isolation layer 61, are formed an electrode for supplying electric current to DBR laser diode 50, and a solder 62. DBR laser diode 50 is then mounted so that a junction thereof faces upward where solder 62 is formed. Thus, a directly coupled SHG laser light source is formed without need for a coupling pair of lenses 40 used with the SHG light source in FIG. 6. The distance between the emission end of DBR laser diode 50 and the incidence end of the SHG device 20 is set to be 3 $\mu$m. Thus, advantageously, with the invention, light emitted from laser diode 50 is introduced into the optical waveguide without first travelling through a lens. A 25 mW wave of light for a laser output of 50 mW is introduced, for example, into the optical waveguide. Hence, a 3 mW wave of blue light is emitted through the emission end of SHG device 20 by controlling the amount of current supplied into the DBR region 52 and matching the laser wavelength to the phase matched wavelength of SHG device 20.

A drive circuit 70 (see FIG. 16) drives DBR laser diode 50 to cause a diode output of a fundamental wave. By simultaneously modulating electric current supplied to activer region 51 and heater 50 of DBR laser diode 50, the fundamental wave outputted by DBR laser diode 50 is modulated.

The modulating operation of the embodiment of FIGS. 16 and 18 will be further described as follows. The amount of heat produced by active region 51 is represented as follows:

$$I1 \times V1 - P \tag{3}$$

wherein I1 is the amount of electric current, in mA, supplied to active region 51; V1 is the operating voltage, in Volts, of active region 51; and P is the laser output in mW. The amount of heat so produced is compensated by heater 60 to keep constant the chip temperature of laser diode 50. More specifically, electric current supplied to heater 60 is increase when electric current supplied to active region 51 is low. Conversely, electric current supplied to heater 60 is decreased when electric current supplied to active region 51 is high. In other words, it is possible to keep the wavelength of oscillation constant by modulating the electric current so that equation (4), shown below, holds true, assuming that Q is the amount of heat produced by heater 60.

$$I1 \times V1 + Q - P = \text{constant} \tag{4}$$

wherein the terms thereof are the same as those priorly described.

Figure 18:
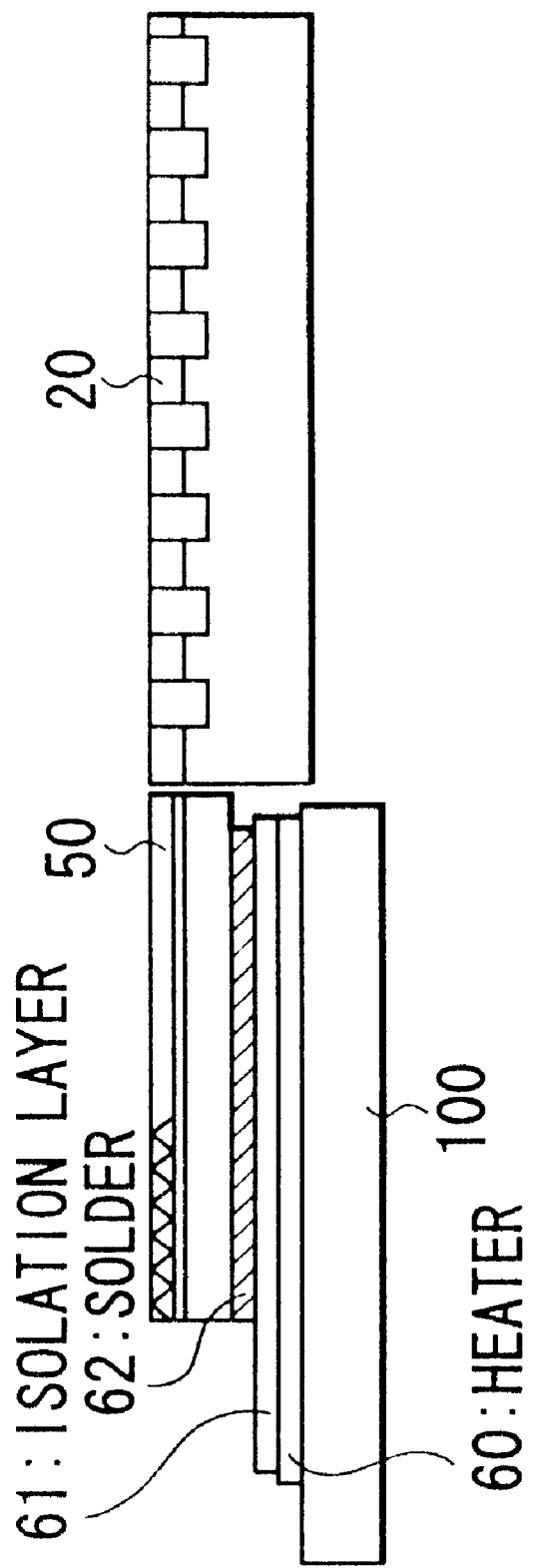
FIG. 18 is a schematic depicting a specific way of coupling DBR laser 50 to SHG device 20.
Figure 19:
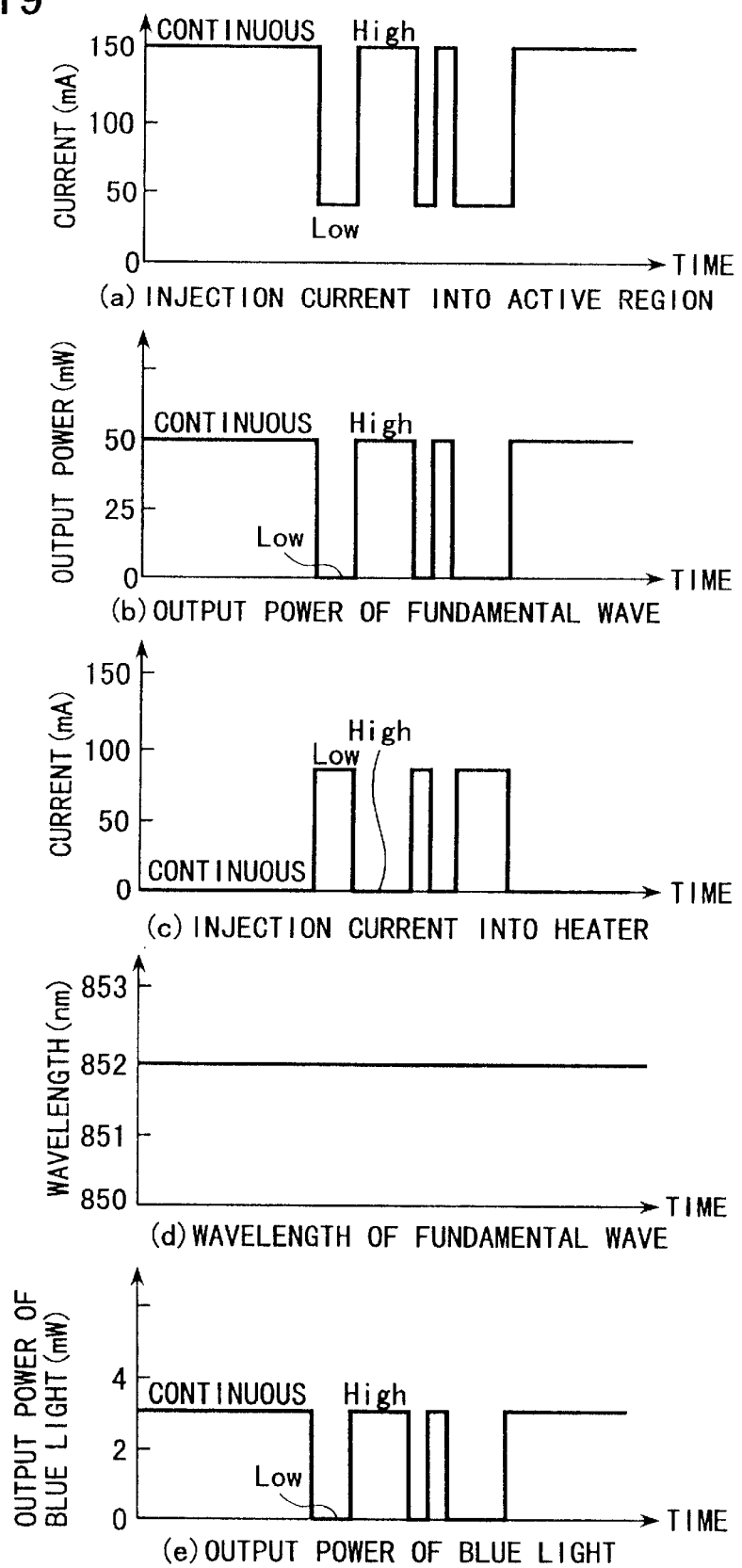
FIG. 19 is a graph depicting operation of the fourth illustrative embodiment of the invention.

The operation of the SHG laser light source of FIGS. 16–18, is described with reference to FIG. 19, wherein (a) represents electric current supplied to active region 51; (b) represents output power of a fundamental wave provided by DBR laser diode 50; (c) represents electric current supplied to heater 60; (d) represents oscillation wavelength of the fundamental wave provided by DBR laser diode 50; and (e) represents the output power of the blue light.

The oscillation threshold of the DBR laser diode 50 is 40 mA. At the start, a constant current of 150 mA and 50 mW is supplied to active region 51 by drive circuit 70, as indicated by graph (a) of FIG. 19. Then, transition is made to a modulation mode. In the modulation mode, a high state level is set at 150 mA, and 50 mW, and a low state level is set at 40 mA and 0 mW. This results in the output power of the fundamental wave provided by DBR laser diode 50, as shown in graph (b) of FIG. 19. Hence, the amount of heat produced at each level of current is as follows:

Constant current and high state levels:

$$I1 \times V1 - P = 150 \text{ mA} \times 2.1 \text{ V} - 50 \text{ mW} = 265 \text{ mW}$$

Low state level:

$$I1 \times V1 - P = 40 \text{ mA} \times 2.1 \text{ V} - 0 \text{ mW} = 84 \text{ mW}.$$

Thus, the difference in the amount of heat is 181 mW between the low state level and the constant current or high state level. Drive circuit 70 controls the amount of electric current supplied to heater 60, as shown in graph (c) of FIG. 19, so that the difference is compensated. In other words, it is possible to produce a heat level of 192 mW when the resistance of the platinum heater 50 is 30 ohms and an electric current of 8 mA is supplied to heater 60. At the start, drive circuit 70 does not provide any electric current to heater 60. Then, transition is made to a modulating operation. In the modulation mode, electric current is set to 0 mA when a modulating current supplied to active region 51 is at a high state level, or to 80 mA when the modulating current is at a low state level. Accordingly, the sum of the amounts of heat produced in activer region 51 and heater 60 remain basically the same even in the modulation mode.

At the start, drive circuit 70 control electric current supplied to DBR region 52 to set the oscillation wavelength of the fundamental wave to the phase matched wavelength of SHG device 20. Hence, it is possible to keep the wavelength constant in the modulation mode, as shown in graph (d) of FIG. 19, without having to vary the electric current supplied to DBR region 52. Hence, it is possible to obtain a stable rectangular waveform, as shown in graph (e) of FIG. 19, as the modulated output waveform of the blue light.

Electric currents supplied to active region 51 and heater 60 are controlled so that the value of "I1×V1+Q−P" is kept almost or substantially constant. This control method makes it possible to modulate the fundamental wave of the DBR laser diode 50 and keep constant the oscillation wavelength. Hence, advantageously, with the invention, it is possible to achieve stable modulation without requirement of an external modulator in a SHG laser light source. Accordingly, the invention provides a simple laser light source which is reliable and economical.

Although the fourth embodiment shows the case where platinum heater 60 transfers heat to both active region 51 and DBR region 52, the invention is also applicable where heat is transferred to either active region 51 alone or DBR region 52 alone. The alternative methods provide the same effects.

Embodiment 5

Figure 20:
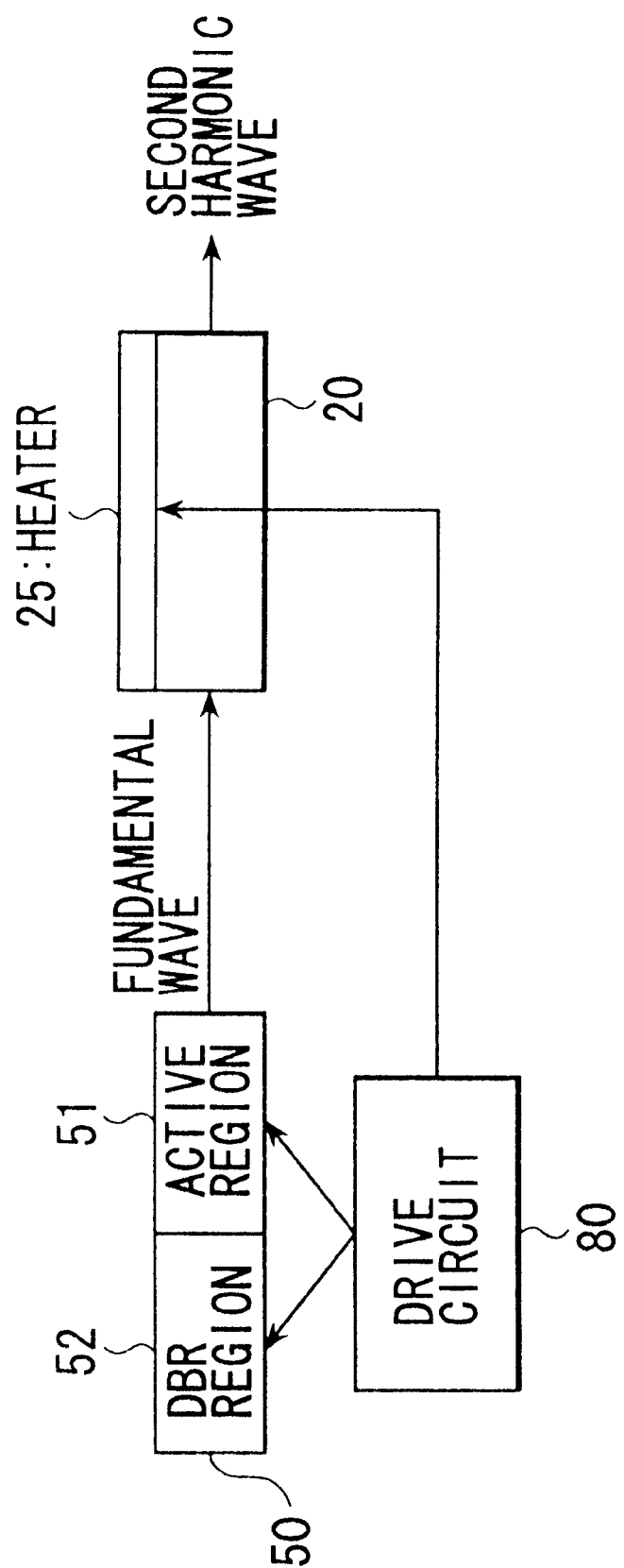
FIG. 20 is a block diagram depicting a fifth illustrative embodiment of the invention.

A fifth embodiment is depicted in FIG. 20 wherein elements identical to those shown in FIG. 16 bear the same symbols and are not discussed hereat for sake of clarity of description. In FIG. 20, a heater 25 supplies heat to SHG device 20. A drive circuit 80 drives DBR laser diode 50 so that the fundamental wave outputted thereby and an electric current supplied to heater 25 are modulated.

Figure 21:
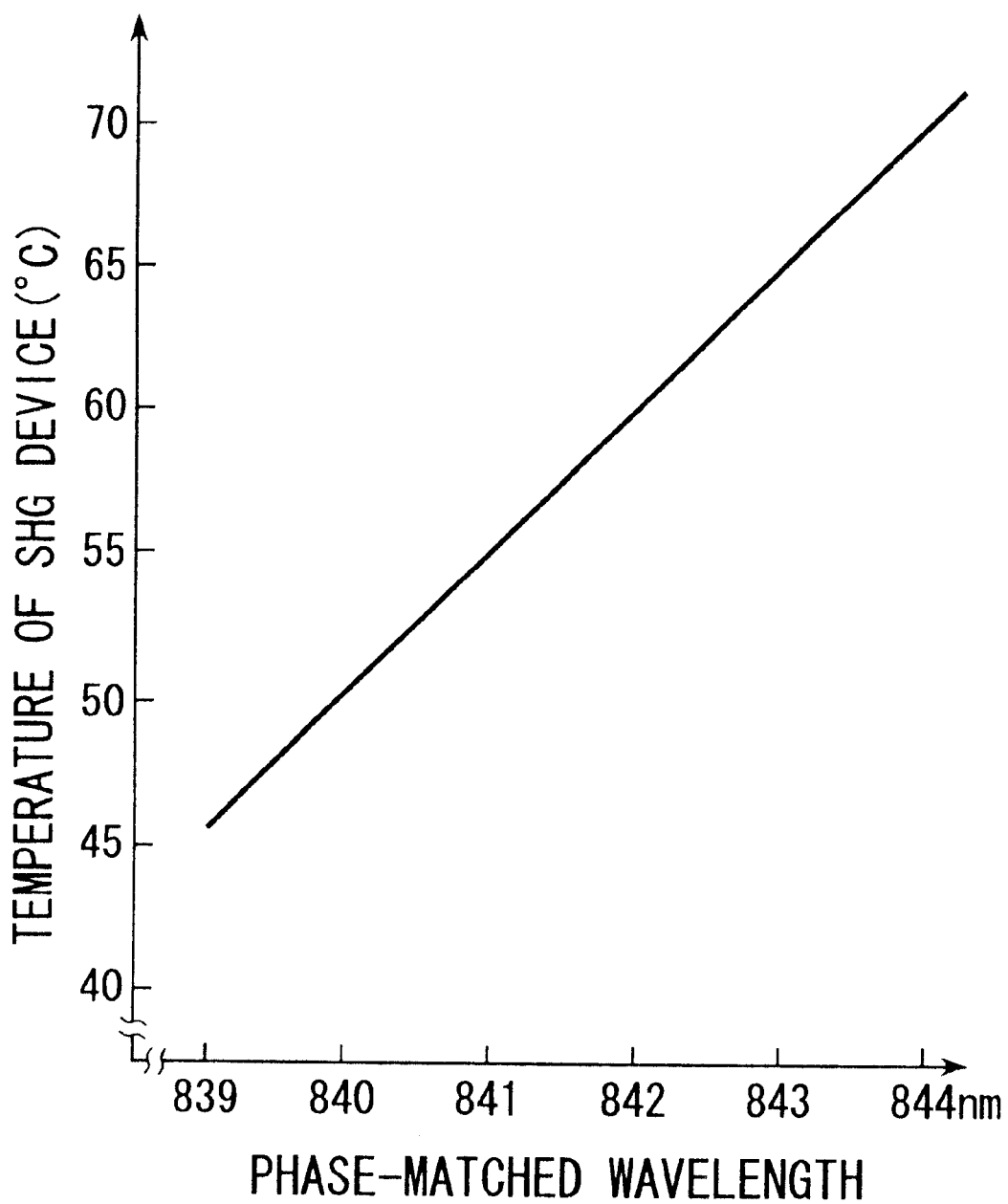
FIG. 21 is a graph depicting the relationship between wavelength of SHG device 20 and temperature.

Operation of the embodiment is described by referring to operation of SHG device 20. As described, for example, in Japan unexamined application 5/53,163, SHG device 20 is temperature dependent and the characteristics thereof are shown in FIG. 21, wherein the horizontal axis represents the phase matched wavelength and the vertical axis represents the temperature of the SHG device 20. As is evident from FIG. 21, the wavelength of the fundamental wave at which the output power of the second harmonic wave outputted by SHG device 20 reaches its peak is varied depending on the temperature.

At the start, drive circuit 80 supplies an electric current to active region 51 of DBR laser diode 50 to cause diode 50 to emit light to thereby provide an output of a fundamental wave. Then, drive circuit 80 controls an electric current to be supplied to DBR region 52 so that the wavelength of the fundamental wave agrees with the wavelength at which the conversion efficiency of SHG device 20 is optimum. The fundamental wave is supplied to SHG device 20 which outputs a second harmonic wave thereof.

The optical output is modulated as follows. When an electric current supplied by drive circuit 80 to active region 51 is varied, the wavelength of the fundamental wave is changed, as shown in FIG. 7. Accordingly, drive circuit 80 varies the electric current supplied to heater 25 according to change in the wavelength of the fundamental wave. Thus, the temperature of SHG device 20 is varied so that the wavelength shown in FIG. 21, at which the conversion efficiency is at its maximum, agrees with the wavelength of the fundamental wave. In other words, drive circuit 80 modulates the electric current supplied to heater 25 of SHG device 20 so that SHG device 20 keeps track of the change in the wavelength of oscillation due to change in the electric current supplied to active region 51.

Specifically, when drive circuit 80 increases or decreases electric current supplied to active region 51 and the wavelength of oscillation is shifted toward the longer wavelength side, or shorter wavelength side, the drive circuit 80 also increases or decreases electric current supplied to heater 25 to increase or decrease the temperature of SHG device 20. Thus, drive circuit 80 shifts the wavelength at which the conversion efficiency reaches its peak, which is toward the longer wavelength side, or shorter wavelength side. Hence, with the invention, it is possible to change the output power of the second harmonic wave by means of change in the output power of the fundamental wave.

As discussed, drive circuit 80 can modulate the second harmonic wave by varying the electric current supplied to active region 51 while simultaneously changing the temperature of heater 25, thereby also simultaneously changing the output power of the fundamental wave and tho phase matched wavelength of the SHG device 20. Thus, advantageously, with the invention, there is no need for an external modulator in the laser source. Accordingly, the invention provides a simple, reliable and economical source of laser light.

Although the fifth embodiment was described with reference to heater 25 being from separate from SHG device 20, the heater may also be formed as a thin film heater on an optical waveguide with SHG device 20. Also, the SHG laser light source may be a three electrode DBR laser diode instead of the just disclosed two electrode DBR laser diode 50.

Embodiment 6

Figure 22:
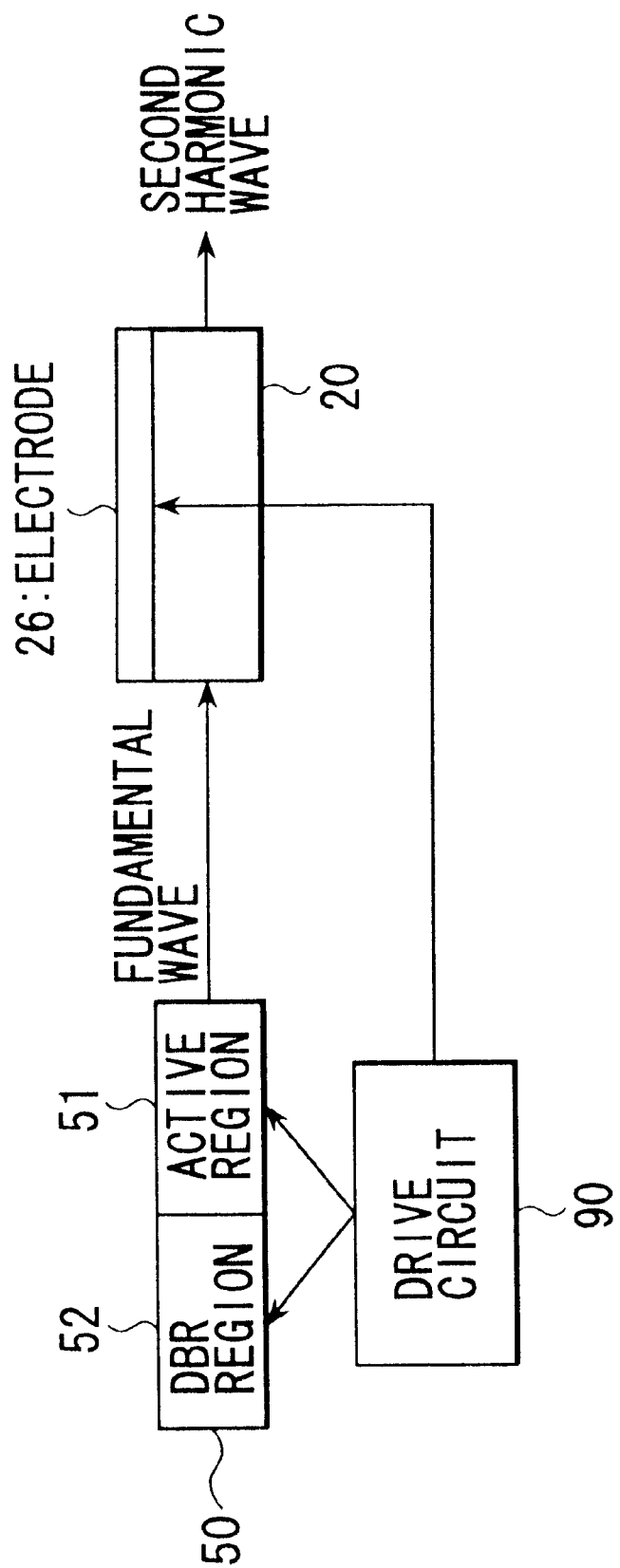
FIG. 22 is a block diagram depicting a sixty illustrative embodiment of the invention.

The sixth embodiment shown in FIG. 22 has identical elements as those shown in FIG. 6 with similar symbols and are not discussed further hereat for clarity of description. In FIG. 22, an electrode 26 supplies an electric field to the optical waveguide of SHG device 20. An example of fabrication of electrode 26 is described with reference to FIG. 23 which is a vertical sectional view of a plane perpendicular to the optical waveguide. Elements identical to those shown in FIG. 5 are referenced with similar symbols and are not further discussed hereat for sake of clarity of description. Electrode 26 comprises electrodes 26a to 26c formed using aluminum (Al). Electrode 26a is formed along optical waveguide 23 on a passivation film 24 formed using silicon dioxide ($SiO_2$), whereat a positive voltage is supplied to electrode 26a from drive circuit 90. Electrodes 26b and 26c are formed on passivation film 24, facing each other with electrode 26a therebetween, and are grounded. Drive circuit 90 drives DBR laser diode 50 to modulate the fundamental wave and supplies voltage to electrode 26. The voltage supplied to electrode 26 may be modulated by drive circuit 90.

The embodiment of FIG. 22 is described with reference to operation of SHG device 20. The wavelength at which a harmonic wave is produced as a result of quasi phase matching, i.e. quasi phase matched wavelength, is determined by the refractive index of a nonlinear optical crystal of the optical waveguide, and the periodicity spacing of a domain inverter region 22 (see FIG. 23). Since the nonlinear optical crystal exhibits a high level of nonlinear optical effect and electrooptical effects, it is possible to change the crystal's refractive index by use of an electric field. The refractive index is varied when the voltage applied to the electrode 26 is changed. As described, for example, in Japan Unexamined application 6/273814, a nonlinear optical crystal has the characteristics depicted in FIG. 24.

Figure 23:
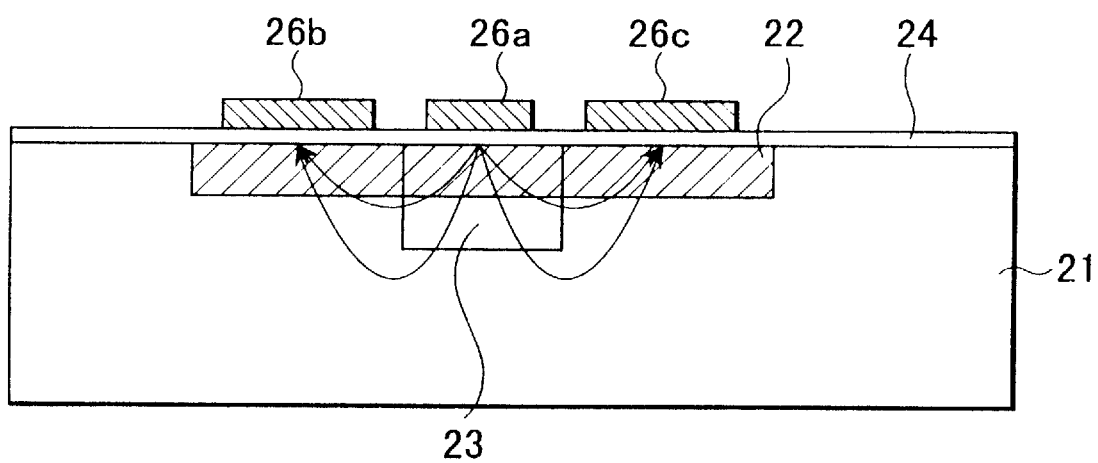
FIG. 23 is a schematic depicting a specific structure of electrode 26.
Figure 24:
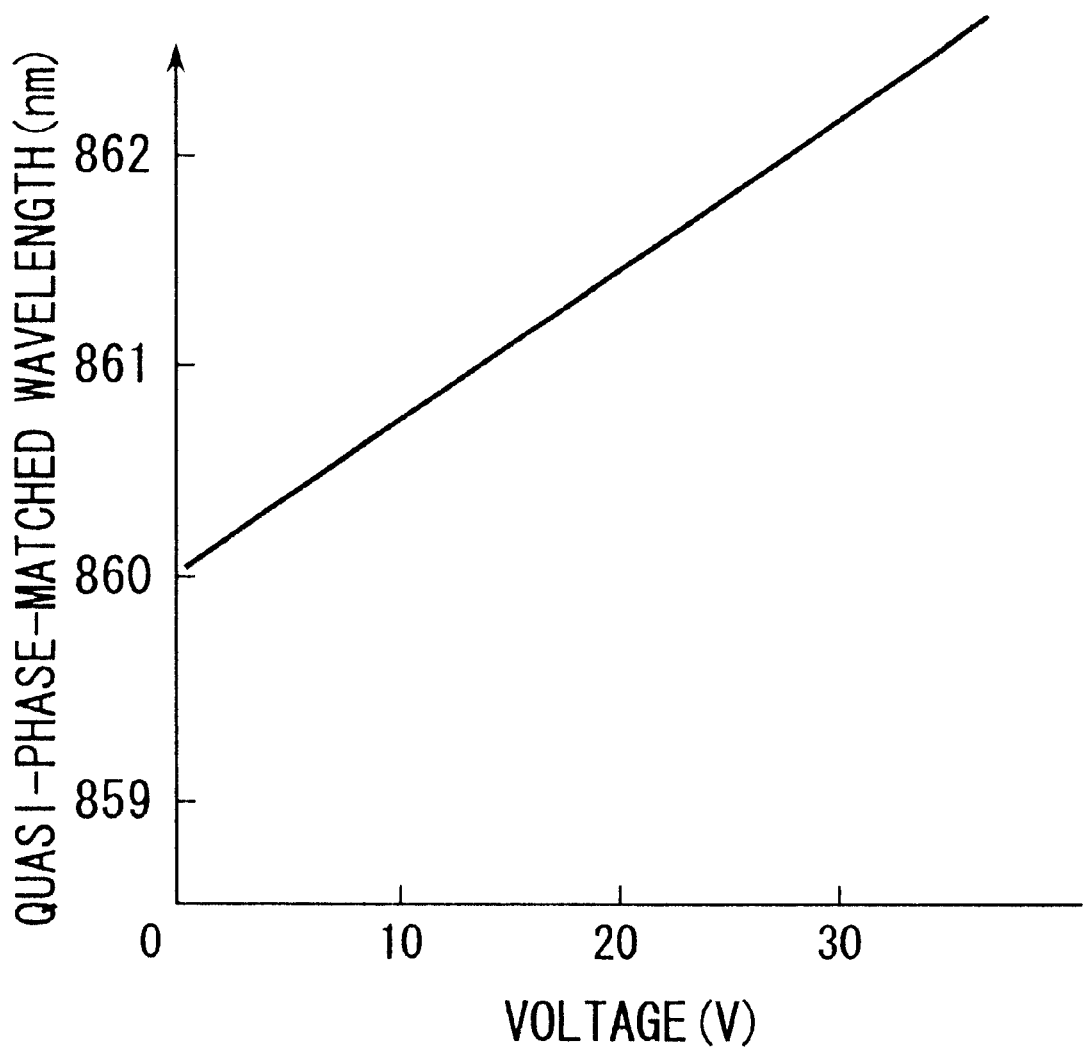
FIG. 24 is a graph depicting relationship between voltage of SHG device 20 and electric fields.

As shown in FIG. 23, the refractive index of the domain inverted regions 22 is decreased when an electric field is supplied to the optical waveguide 23. Conversely, the refractive index of the non-domain inverted region is increased. The non-domain inverted region is defined as the remainder of the optical waveguide 23 from which is excluded the domain inverted regions 22. For this reason, changes in refractive index in the two regions are cancelled by each other. However, since the majority of the fundamental wave propagated through optical waveguide 23 goes through the non-domain inverted region, the refractive index is changed on average. Hence, it becomes possible to modulate the quasi phase matched wavelength by use of the modulated voltage or electric field.

Accordingly, drive circuit 90 supplies an electric current to active region 51 of DBR laser diode 50 to cause diode 50 to emit light, thus producing an output of a fundamental wave. Then, drive circuit 90 controls an electric current supplied to DBR region 52 so that the wavelength of the fundamental wave agrees with the wavelength at which conversion efficiency of SHG device 20 is optimum. The fundamental wave is supplied to SHG device 20 which outputs a second harmonic wave thereof.

The optical output is modulated as follows. When an electric current supplied by drive circuit 90 to active region 51 is varied, the wavelength of the fundamental wave is changed, as shown in FIG. 7. Accordingly, drive circuit 90 varies the voltage supplied to electrode 26 according to change in the wavelength of the fundamental wave. Thus, the electric field applied to optical waveguide 23 is varied so that the wavelength shown in FIG. 24, at which the conversion efficiency is at a maximum, agrees with the wavelength of the fundamental wave. In other words, drive circuit 90 modulates the voltage supplied to electrode 26 so that the SHG device keeps track of the change in the wavelength of the oscillation due to change in electric current supplied to active region 51.

More specifically, when drive circuit 90 increases, or decreases, electric current supplied to active region 51, and therefore, the wavelength of the oscillation is shifted toward the longer wavelength or shorter wavelength, the drive circuit 90 also increases or decreases the voltage supplied to electrode 26 to increase or decrease the electric field intensity of SHG device 20. Thus, drive circuit 90 shifts the wavelength at which conversion efficiency is at a peak, towards the longer wavelength, or shorter wavelength.

Hence, it is possible to change the output power of the second harmonic wave by changing the output power of the fundamental wave.

Drive circuit 90 modulates the second harmonic wave by varying the electric current supplied to active region 51 and simultaneously changing the voltage of electrode 26. This causes changing of the electric field supplied to optical waveguide 23, and simultaneously changing of the output power of the fundamental wave and the phase matched wavelength of SHG device 20. Thus, advantageously, with the invention, there is no need for an external modulator in the laser light source. Accordingly, the invention provides a simple, efficient, economical and reliable source of second harmonic waves of laser light.

Figure 25:
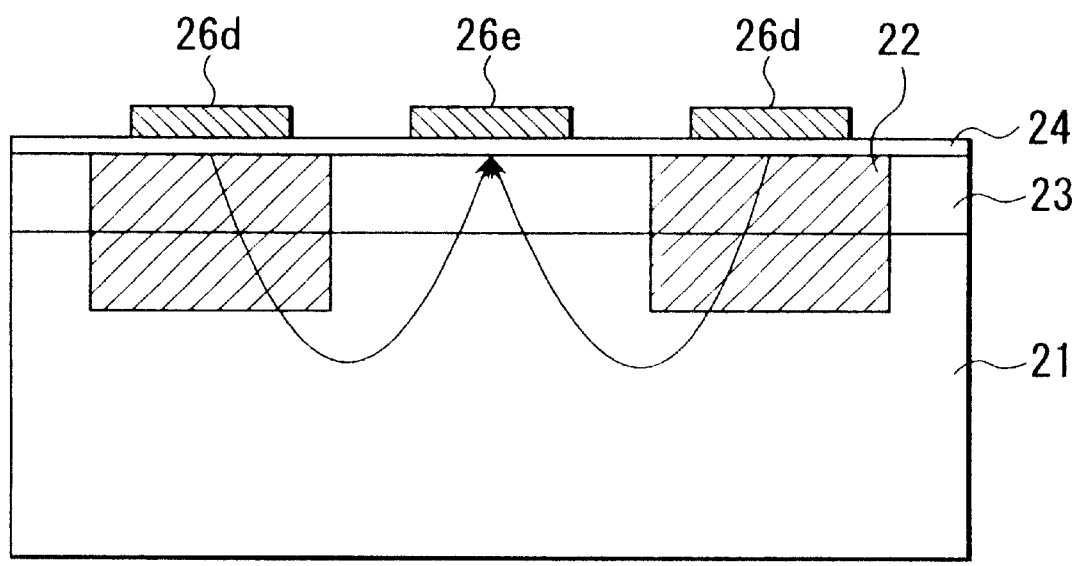
FIG. 25 is a schematic depicting another specific structure of electrode 26.

The electrode 26 may be fabricated as shown in FIG. 25, wherein electrode 26 comprises electrodes 26d and 26e formed using aluminum. Electrodes 26d and 26e are formed as comblike electrodes having a periodicity of teeth corresponding to that of the domain inverted regions 22. Electrodes 26d and 26e are formed on domain inverted regions 22 and non-domain inverted region, respectively, with the passivation film 24 disposed therebetween. Electrode 26d is supplied with a positive voltage from drive circuit 90 and electrode 26e is grounded. When voltage is supplied to electrode 26d, the refractive indexes of both the domain inverted regions 22 and the non-domain inverted region increase. Thus, the quasi phase matched wavelength is changed considerably.

Embodiment 7

Figure 26:
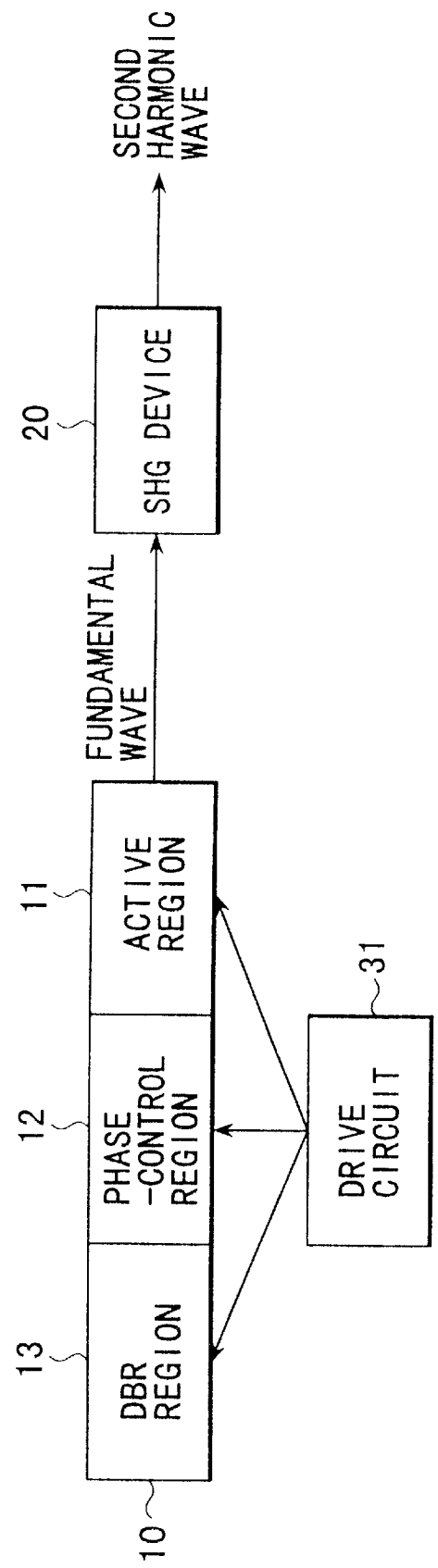
FIG. 26 is a block diagram depicting a seventh illustrative embodiment of the invention.

The seventh embodiment is shown in FIG. 26, wherein elements identical to those shown in FIG. 3 are similarly referenced and description thereof is omitted hereat for clarity of description. In FIG. 26, a drive circuit 31 supplies a constant drive current to active region 11, a varied DBR drive current to DBR region 13 and a phase control current to phase control region 12, at a desired, specific rate of change, in order to intensity modulate a second harmonic wave generated by SHG device 20.

Figure 27:
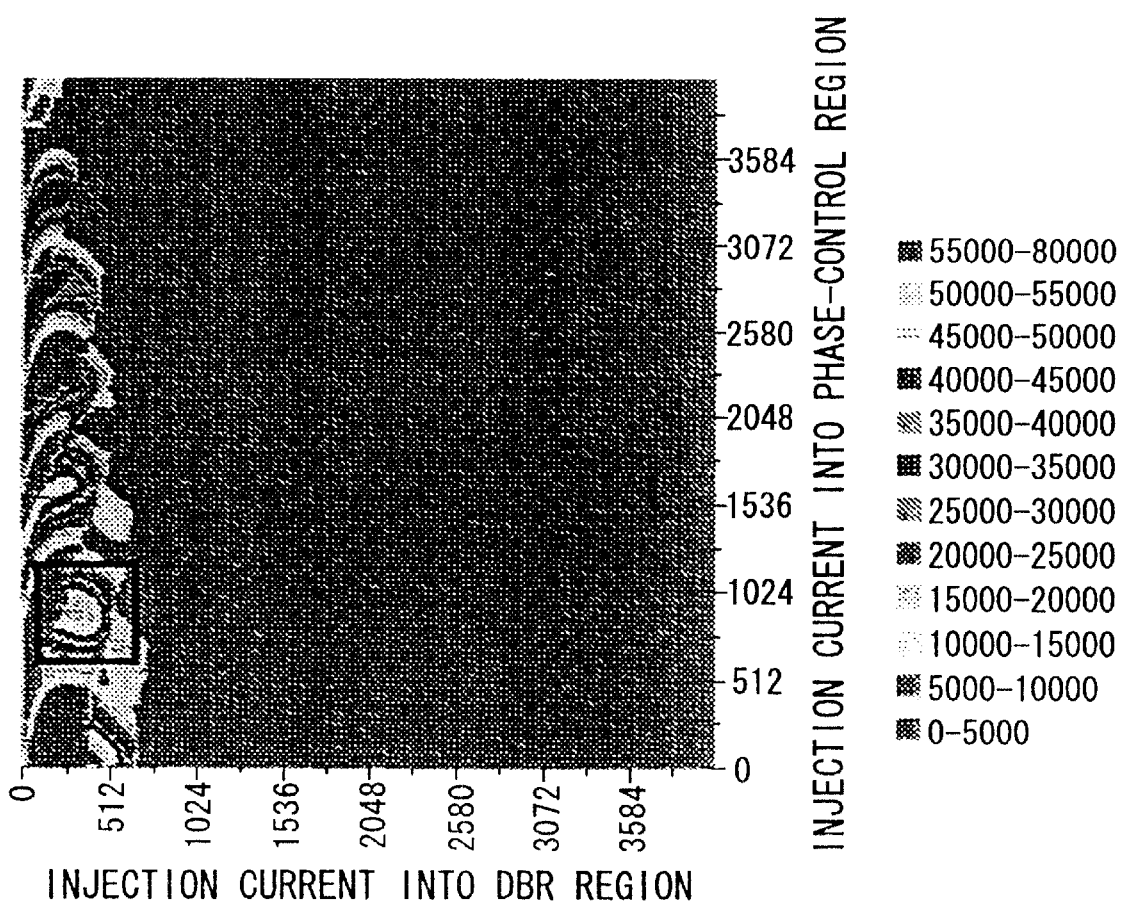
FIG. 27 is a graph depicting the relationship between a DBR drive current, a phase control current, and output power of blue light.
Figure 28:
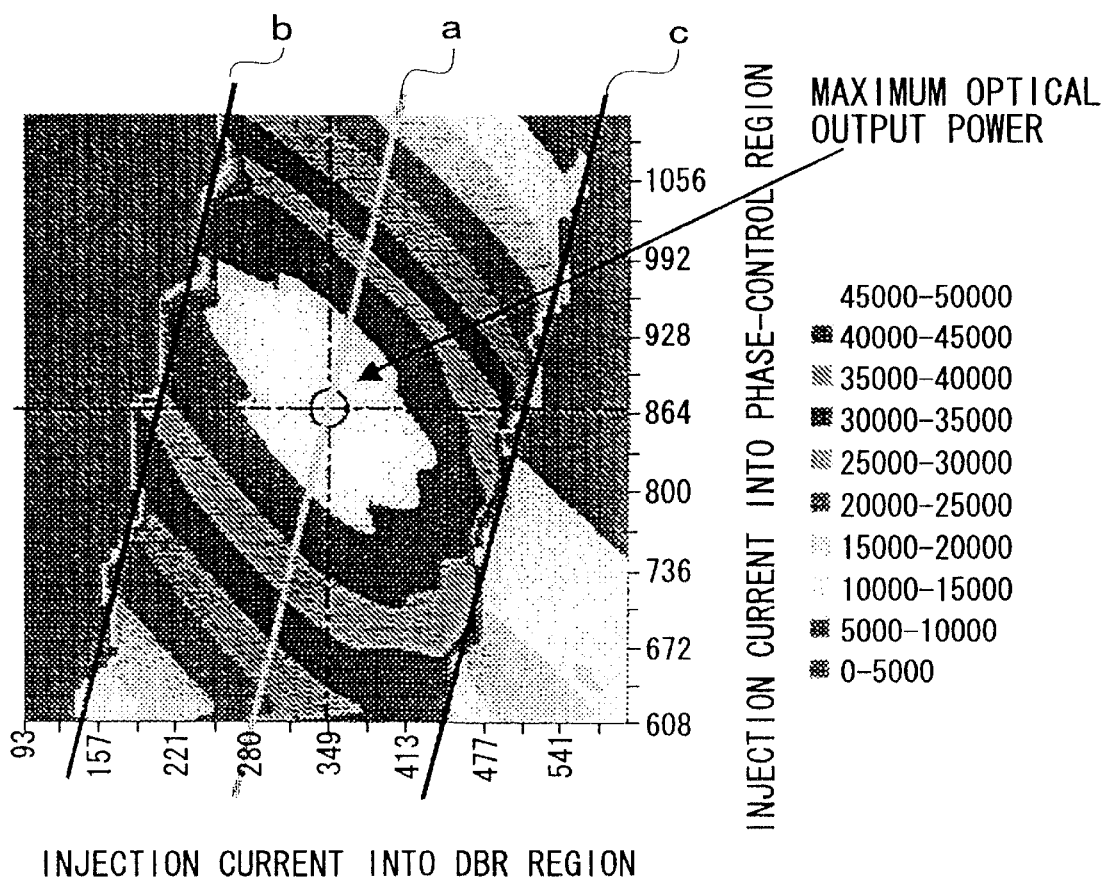
FIG. 28 is an enlarged view of a specific area of FIG. 27.

The operation of the embodiment is described with reference to output power of blue light which is dependent on the relationship between the DBR drive current and the phase control current, such as shown in FIGS. 27 and 28, wherein the relationship between DBR drive current, phase control current, and output power of the blue light, are depicted. FIG. 28 shows an enlarged view of a specific area of FIG. 27. DBR drive current is defined as ranging from 0x0000 to 0x0FFF (from 0 to approximately 120 mA) and the phase control current is defined as ranging from 0x0000 to 0x0FFF (0 to approximately 60 mA). The symbol 0x denotes a hexadecimal number and the scale values of the graphs shown in FIGS. 27 and 28 are decimals.

As evident from FIG. 27, blue light is emitted only within a specific range. More specifically, the blue light is emitted only within the range of the DBR drive current from 0x0 to 0x300.

Figure 29:
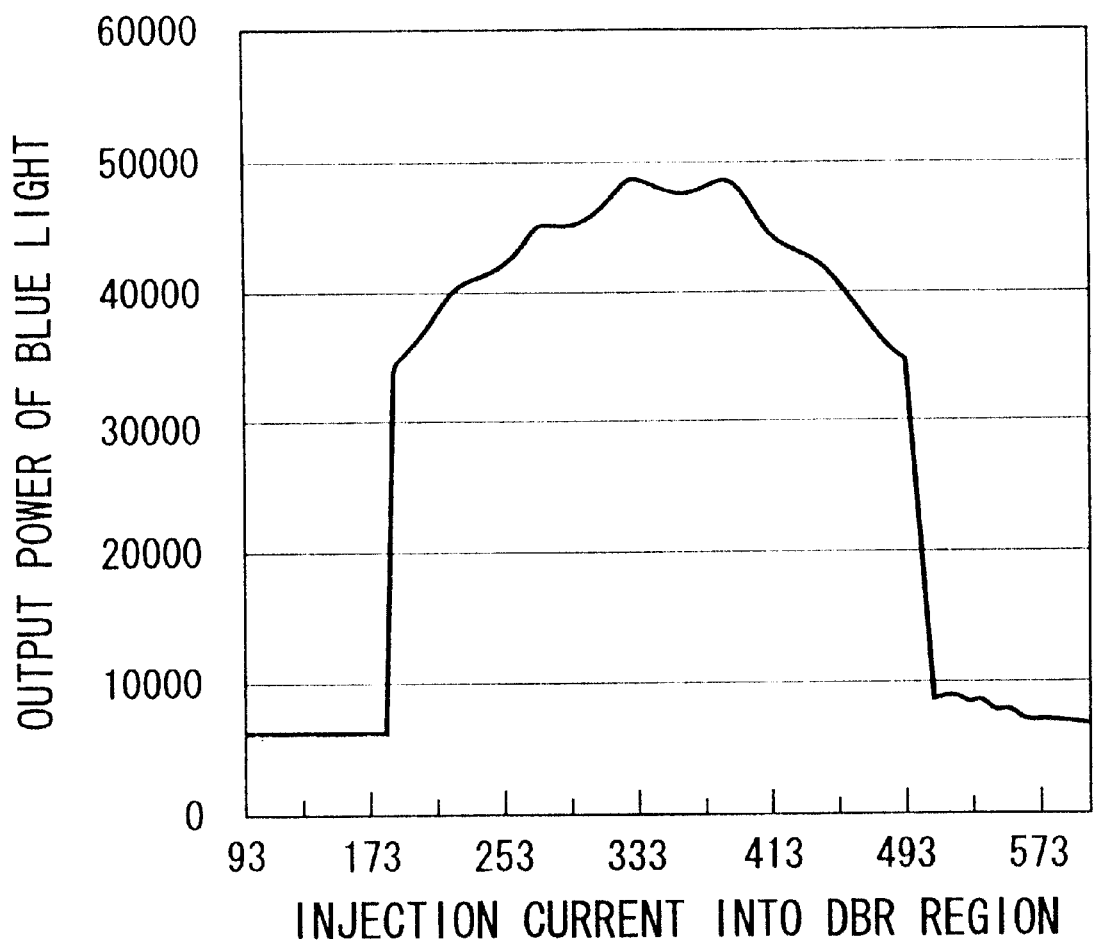
FIG. 29 is a graph depicting relationship between output power of blue light and DBR drive current.

The operation of the embodiment is further explained with reference to FIG. 28 which is an enlarged view of the area enclosed within a square in FIG. 27, and indicates a higher power output level of blue light. As shown in FIG. 28, the output power of blue light is characterized by a mountained shaped pattern of power distribution having a width of "b"–"c" with reference to the DBR drive current. Also, FIG. 29 shows results obtained by varying the DBR drive current with the phase control current being fixed. As is evident from FIG. 29, straight line segments "b" and "c" (of FIG. 28) are the traces of points where the output power of blue light is changed greatly.

Accordingly, as is evident from FIG. 28, the output power of blue light can be modulated by varying the DBR drive current and the phase control current along the line segment "a", from the point on line segment "a" at which the output power is at a maximum. Although in FIG. 28, line segment "a" passes through the area whereat the output power is at a maximum, the point at which the maximum output power is available may appear in the vicinity of line segments "b" or "c", depending on the combination of DBR laser diode 10 and SHG device 20. In that case, the output power of the second harmonic wave may become unstable when too much importance is placed on the maximum output power. Thus, the second harmonic wave should be preferably intensity modulated at a point as close as possible to the middle of line segments "b" or "c".

Considering the foregoing, drive circuit 31 supplies DBR diode 10 with active region drive current, DBR drive current and phase control current at the point in time at which the output power becomes maximum on line segment "a". Then, drive circuit 31 varies the DBR drive current and phase control current at the rate of change represented by the slope of the line segment "a" shown in FIG. 28, with the active region drive current being kept constant. Hence, the output power of the second harmonic wave provided by SHG device 20 is decreased and light intensity modulation is carried out.

Advantageously, with the invention it is possible to intensity modulate the output second harmonic wave by keeping constant the drive current supplied by drive circuit 31 to active region 11, while concurrently varying the DBR drive current and phase control current at a desired, specific rate of change. Thus, advantageously, with the it invention, there is no need for any external modulator, such as required in the prior art, and hence the invention provides a simple, economical reliable, and efficient laser light source.

Embodiment 8

Figure 30:
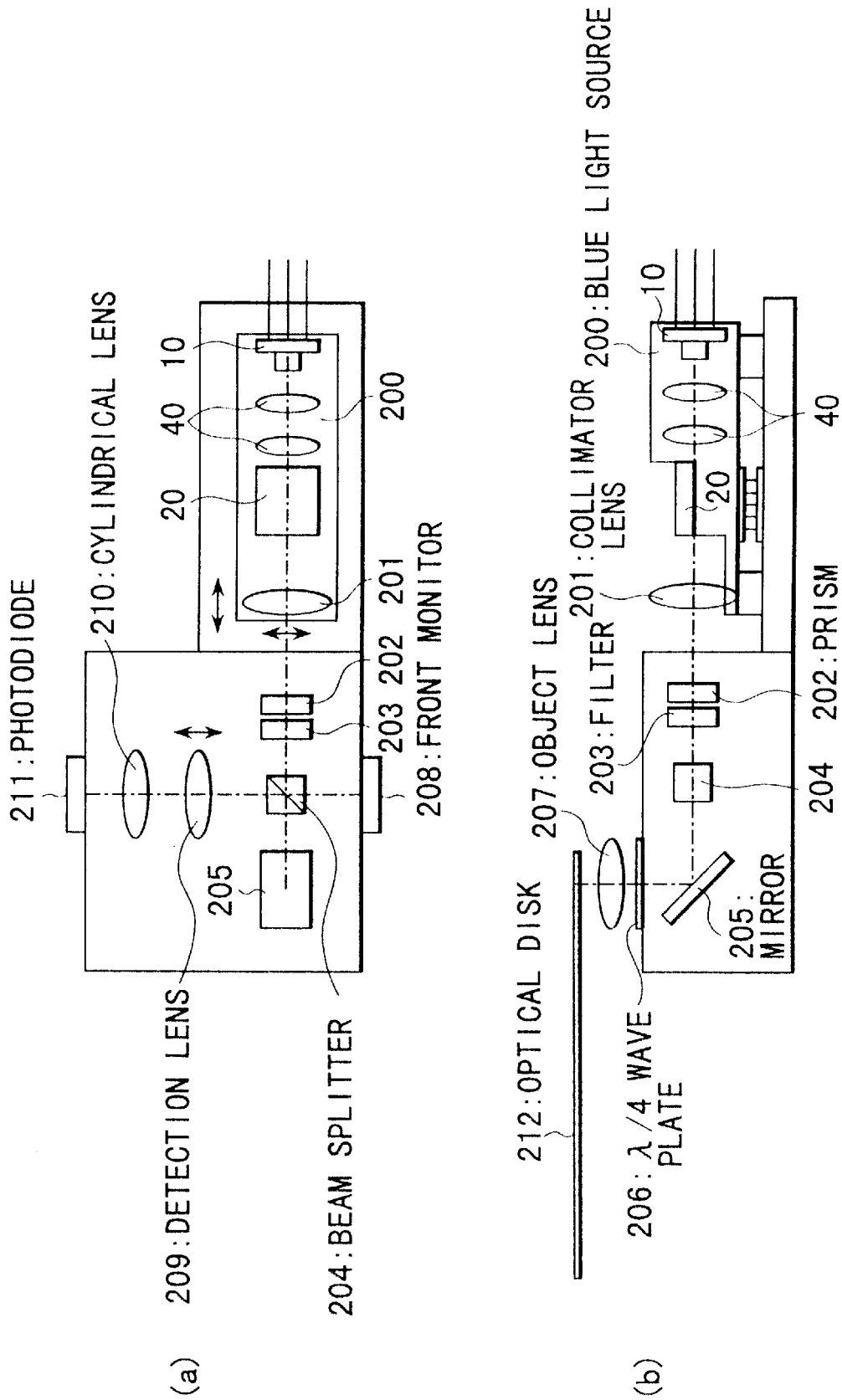
FIG. 30 is a block diagram depicting an eighth illustrative embodiment of the invention.

The eighth embodiment, shown in FIG. 30, comprises an optical pickup head for reading and/or writing information and provided with the blue light source shown, for example, in FIG. 3. FIG. 30 comprises a top view (a) and a side view (b). The optical pickup head for reading and writing information comprises an SHG light source, which is a blue light source, 200, a collimator lens 201, a prism 202, a filter 203 for filtering or cutting off only a fundamental wave, a polarization beam splitter 204, a mirror 205, a quarterwave plate 206, an object lens 207, a front monitor 208, a detector lens 209, a cylindrical lens 210, and a photo diode 211. The blue light source 200 comprises a DBR laser diode 10, an SHG device 20, and a pair of lenses 40. Additionally, an actuator, which is not shown, keeps constant the distance between the object lens 207 and the optical disk 212.

The optical disk 212 is a recordable, phase change optical disk which is made, for example, of a polycarbonate substrate on which a $ZnS-SiO_2$ layer is deposited. The layer is overlaid with GeSbFe layer, which is a recording layer. Then, the recording layer is further overlaid with another $ZnS-SiO_2$ layer. Finally, an aluminum layer is deposited as a reflection layer.

The embodiment is operated as follows. Blue light emitted from the optical waveguide of SHG light source, which is also called a "blue light" source, 200 is made parallel by collimator lens 201. The parallel blue light is passed through prism 202 to filter 203, whereat the fundamental wave is filtered. The blue light is then split into two beams by beam splitter 204. One blue light beam, whose path is now 90° different from the original path is supplied to front monitor 208, whereat the beam intensity is detected. The other blue light beam is passed through the beam splitter 204 and is reflected by mirror 205, then passed through quarter wave plate 206, whereat the beam is changed to be circularly polarized beam. The blue light beam is focused by object lens 207 onto the optical disk 212. The numerical aperture (NA) of the object lens 207 used in the embodiment is 0.6.

The blue light beam reflected by optical disk 212 is passed through quarter wave plate 206, whereat the polarization is rotated by an angle of 90° from the original beam direction. The path, taken by the reflected blue light beam through reflection by mirror 205, is turned 90° by polarization beam splitter 204. The blue light beam, passed through the detector lens 209 and cylindrical lens 210, is guided into photo diode 211. The photo detector 211 has a quadrant input stage to detect an RF signal, a focus signal and a tracking signal. In the embodiment, the focus servo is based on an astigmatism method, whereas the tracking servo is based on a push pull method.

A method of recording on the optical disk is described with reference to FIG. 31. The phase change optical disk 212 is a medium for recording information by taking advantage of the difference between crystal state and amorphous state optical constants. Any initialized recording medium is in a crystal state. When the optical disk is exposed to a radiation of blue laser light with a power level of approximately 10 mW, the temperature of the crystal structure exceeds the melting point thereof. When relieved from laser radiation and quenched, the crystal structure is changed into an amorphous state. Thus, an amorphous state mark is secured on the recording medium. When the optical disk is once again exposed to a radiation of blue laser light with a power level of approximately 5 mW, the crystal structure is changed from an amorphous state back to a crystal state, so as to erase the marked spot.

An electric current supplied to active region 11 of a three electrode, variable wavelength DBR laser diode 10, which is a source of fundamental waves, is shown in graph (a) of FIG. 31. Similarly, an electric current supplied to phase control region 12 is shown in graph (b) of FIG. 31. The electric current supplied to active region 11 is set to 250 mA for a high state level, in order to obtain a power level of blue light of 10 mW on the optical disk.

The oscillation threshold of DBR laser diode 10 is 40 mA. At the start, a constant current of 190 mA and 70 mW, is supplied to active region 11 by drive circuit 30. Then, transition is made to a modulation mode. In the modulation mode, a high state level is set to 250 mA and 100 mW, and a low state level is set to 40 mA and 0 mW. Thus, the amount of heat produced at each level of current is as follows:

Constant current level:

$$I1 \times V1 - P = 190\ mA \times 2.1\ V - 70\ mW = 329\ mW$$

High state level:

$$I1 \times V1 - P = 250\ mA \times 2.1\ V - 100\ mW = 425\ mW$$

Low state level:

$$I1 \times V1 - P = 40\ mA \times 2.1\ V - 0\ mW = 84\ mW.$$

Thus, the difference in amount of heat is 96 mW for the high state level and 245 mW for the low state level, as compared to the constant current level.

On the other hand, electric current supplied by drive circuit 30 to phase control region 12 is set so as to compensate the amount of heat produced in active region 11. At the start, a constant current of 83 mA is supplied to phase control region 12. Then, transition is made to a modulation mode. In the modulation mode, the electric current is set to 38 mA when a modulation current, supplied to active region 11, is at a high state level, or to 200 mA when the modulating current is at a low state level. Thus, the amount of heat produced at each level of current is as follows:

Constant current level:

$$I2 \times V2 = 83 \text{ mA} \times 2.1 \text{ V} = 174.3 \text{ mW}$$

High state level:

$$I2 \times V2 = 38 \text{ mA} \times 2.1 \text{ V} = 79.8 \text{ mW}$$

Low state level:

$$I2 \times V2 = 200 \text{ mA} \times 2.1 \text{ V} = 420 \text{ mW}$$

This results in the following amounts of heat being produced in DBR laser diode 10 at each level of current.

Constant current level:

$$I1 \times V1 + I2 \times V2 - P = 503.3 \text{ mW}$$

High state level $$I1 \times V1 + I2 \times V2 - P = 504.8 \text{ mW}$$

Low state level $$I1 \times V1 + I2 \times V2 - P = 504 \text{ mW}.$$

Accordingly, the sum of the amounts of heat produced in active region 11 and phase control region 12 is basically the same in both the constant current mode and the modulation mode. Hence, it is possible to maintain the wavelength of oscillation of the fundamental wave to be substantially equal in both the constant current mode and the modulation mode. For characteristics regarding the output power of the blue light, it is also possible to obtain a stable rectangular wave with the constant current mode output power of 8 mW and the peak output power of 16 mW, as shown in graph (c) of FIG. 31. The embodiment also provides a stable modulated waveform for varied pulse widths or periods.

In the embodiment of FIG. 30, the efficiency of use of light energy made by an optical pickup is adjusted to approximately 60% using the prism 202. Accordingly, the embodiment provides a constant current power mode of approximately 5 mW and a peak output power of 10 mW, as the output power of blue light focused by object lens 207 onto the optical disk 212. Accordingly, it is now possible, with the invention, to form marks on the phase change optical disk 212 and the cause their erasure easily, reliably and economically.

The embodiment provides a stable modulated waveform even for varied pulse widths or periods. Hence, it is possible to realize a more highly dense recording than previously possible, such as high as 12 GB, on an optical disk 212, which can be as wide as 12 cm. Additionally, since there is no need for an external modulator, it is possible, with the invention, to reduce the size of the optical pick up head for reading and/or writing information.

By using any one of the blue light sources of the invention, such as described as embodiments 2 to 7, a stable modulated waveform is obtained for a variety of pulse widths and/or periods. Accordingly, high density recording with marks is feasible with the invention. Also, since there is no need for any external modulator, the light source and pickup head is simple, efficient, reliable and economical.

Embodiment 9

Figure 32:
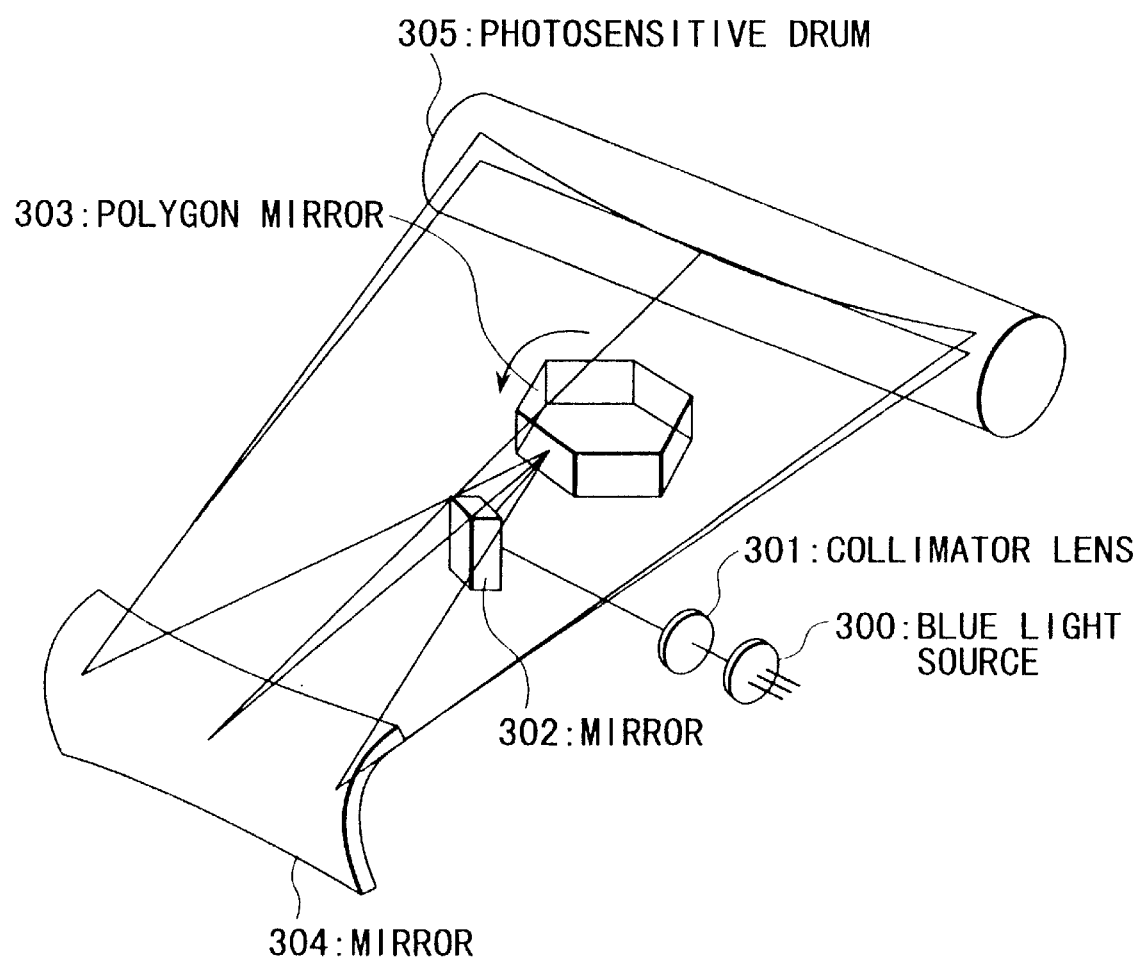
FIG. 32 is a schematic depicting a ninth illustrative embodiment of the invention.

The 9th embodiment comprises a laser printer, as depicted in FIG. 32 and is provided with the blue light source, such as shown in FIG. 16. The laser printer comprises a blue light source 300, a collimator 301, a prism, a cylindrical lens, a filter, a mirror 302, a polygon mirror 303, a mirror 304, and a photosensitive drum 305. the prism, cylindrical lens and filter would be disposed between the collimator lens 301 and mirror 302, but for sake of clarity of description have been omitted from the drawing and description.

The laser printer operates as follows. Blue light emitted from blue light source 300 is made parallel by collimator 301. The parallel light is passed through the prism to reach the filter, which filters only the fundamental wave. The blue light is then reflected by mirror 302 and introduced to polygon mirror 303 which is rotated to reflect the blue light onto mirror 304. Thus, the blue light is focused by reflective mirror 304 onto photosensitive drum 305. Hence, information is provided by means of the blue light impinging onto photosensitive drum 305. The drum 305 is then supplied with a toner and an image form on the drum is transferred onto paper.

The blue light source 300 is operated in such a manner that modulation is carried out as described with reference to FIG. 19. More specifically, a constant current of 150 mA and 50 mW is supplied to active region 51 by drive circuit 70 at the start. Then, transition is made to a modulation mode. In the modulation mode, a high state level is set to 150 mA and 50 mW and a low state level is set to 40 mA and 0 mW.

Drive circuit 70 controls the amount of electric current supplied to heater 60 so that the difference in amount of heat produced in active region 51 is compensated. At the start, drive circuit 70 does not supply any electric current to heater 60. Then, transition is made to a modulation mode. In the modulation mode, the electric current is set to 0 mA when a modulating current supplied to active region 51 is at a high state level, or to 80 mA when the modulating current is at a low state level.

Consequently, blue light source 300 provides output power of 3 mW in a constant current mode. In the modulation mode, light source 300 provides 3 mW for a high state level and 0 mW for a low state level. Accordingly, it is possible to consistently produce a wide range of rectangular waves of light, from continuous waves of 20 ns wide pulses. The regulation of peak output power is no greater than 1%. For a 3 mW output power level of blue light source 300, a 300 $\mu$W beam of light is focused onto the photo sensitive drum 305, with the resulting size of the spot of light being only 30 $\mu$m wide. It is therefore possible, with the invention, to realize a high definition printing system. Additionally, since there is no need for an external modulator, the size of the printing system or printer using the invention is substantially smaller than the prior art.

By using any one of the blue laser light sources of embodiments 1 and 2, and 4 to 7, a stable modulated waveform is obtained for a variety of pulse widths and periods. Accordingly, a high definition printing system is feasible with use of the other embodiments. Also, since there is no need for an external modulator in any of the embodiments of the invention, the laser printer using the invention is substantially reduced in size, cost and increased reliability and salability.

The invention, advantageously, offers the following, and other advantages.

(1) A drive circuit modulates a plurality of electric currents or voltages supplied to a laser diode, thus varying the output power thereof and suppressing change in the wavelength simultaneously. Hence, there is no need for any external modulator in the SHG laser light source, and simplification of structure is attained. Also, when simplification is attained, reliability is increased, and costs are reduced.

(2) A plurality of electric currents or voltages supplied to a laser diode are modulated, thus varying the output power of the laser diode and suppressing change in the wavelength, simultaneously. Hence, there is no need for any external modulator so that the invention SHG laser light source is simple in configuration, economical, and reliable.

(3) A drive circuit modulates an electric current supplied to an active region and compensates the amount of change in the wavelength (or phase change) of the laser diode by supplying an electric current to the phase control region. Hence, need for external modulator is eliminated and simplicity of configuration is attained.

(4) An electric current supplied to an active region is modulated and the amount of change in the wavelength (or phase change) of the laser diode is compensated by supplying an electric current to the phase control region. Hence, need for external modulator is eliminated and simplicity of configuration of an SHG laser light source is attained.

(5) A drive circuit pulse modulates an electric current or voltage supplied to a laser diode to control the output power of a second harmonic wave. Hence, it is possible to linearly control the output power of the second harmonic wave using the duty cycle of the pulse modulation and without having to take into account the square law characteristics of the SHG device. Hence, need for external modulator is eliminated and simplicity, reliability and economy are attained with the inventive laser light source.

(6) A drive circuit pulse modulates a plurality of electric currents or voltages supplied to a laser diode. Hence, it is possible to vary the power output of the fundamental wave while simultaneously suppressing change in the wavelength.

(7) An electric current or voltage supplied to a laser diode is pulse modulated to control the output power of the second harmonic wave. Hence, it is possible to linearly control the output power of the second harmonic wave using the duty cycle of the pulse modulation and without having the consider the square law characteristics of the SHG device. Hence, need for an external modulator is eliminated and simplicity of structure of the SHG laser light source is attained.

(8) A plurality of electric currents or voltages supplied to a laser diode are pulse modulated simultaneously. Hence, it is possible to vary the output power of the fundamental wave while simultaneously suppressing change in the wavelength.

(9) A drive circuit modulates the fundamental wave of the laser diode while simultaneously modulating an electric current supplied to a heater, thereby suppressing change in wavelength. Hence, need for external modulator is eliminated and a simplified configuration is attained for an SHG laser light source.

(10) The fundamental wave of a laser diode is modulated, while simultaneously modulating an electric current supplied to a heater, thereby suppressing change in the wavelength thereof. Hence, need for external modulator is eliminated and a simplified configuration is attained for an SHG laser light source.

(11) A drive circuit modulates the fundamental wave of the laser diode while simultaneously an electric current supplied to a heater thereby to modulate the phase matched wavelength of the SHG device. Hence, need for external modulator is eliminated and a simplified configuration is attained for an SHG laser light source.

(12) The fundamental wave of the laser diode is modulated while simultaneously modulating an electric current supplied to a heater thereby modulating the phase matched wavelength of the SHG device. Hence, need for external modulator is eliminated and a simplified SHG laser light source is attained by the invention.

(13) A drive circuit modulates the fundamental wave of the laser diode while simultaneously modulating a voltage supplied to an electrode, thereby also modulating an electric field in the optical waveguide of the SHG device, and thus modulating the phase matched wavelength of the SHG device. Hence, need for external modulator is eliminated and a simplified SHG laser light source is attained.

(14) The fundamental wave of the laser diode is modulated while simultaneously modulating a voltage supplied to an electrode, thereby also modulating the electric field in the optical waveguide of the SHG device, thus modulating the phase matched wavelength of the SHG device. Hence, need for an external modulator is eliminated and a simplified SHG laser light source is attained.

(15) It is possible to modulate a second harmonic wave by keeping constant a drive current supplied by a drive circuit to an active region and varying a DBR drive current and a phase control current at a desired, specific rate of change. Hence, need for external modulator is eliminated and a simplified SHG laser light source is attained.

(16) It is possible to modulate a second harmonic wave by keeping constant a drive current supplied to an active region and varying a DBR drive current and a phase control current at a desired, specific rate of change. Hence, need for external modulator is eliminated and a simplified SHG laser light source is attained.

(17) Because there is no need to use an external modulator, the invention reduces the size of a system for generating laser light. Thus, the cost of such system is reduced, and reliability is increased. Advantageously, the invention can be used to achieve high density recording.

(18) Because there is no need to use an external modulator, the invention reduces the size of an SHG laser light source. Thus, cost is reduced and reliability is increased. Advantageously, the invention can be used to realize a high definition printing system.

The foregoing description is illustrative of the principles of the invention. Numerous modifications and extensions thereof would be apparent to the worker skilled in the art. All such modifications and extensions are to be considered to be within the scope and spirit of the invention.

What is claimed is:

1. An SHG laser light source comprising:
    a laser diode including an active region for producing an output wave by means of one or more modulated electric currents or voltages, a phase control region for adjusting phase of said output wave by means of said one or more modulated electric currents or voltages, and a DBR region for adjusting reflection characteristics of a diffraction grading therein by means of said one or more modulated electric currents or voltages and thereby change wavelength of said output wave;
    drive means for supplying said one or more modulated electric currents or voltages to said laser diode so that said laser diode outputs a modulated fundamental wave, said drive means comprising means for modulating said one or more electric currents or voltages so that total amount of energy is substantially constant, and means for controlling said one or more electric currents or voltages so that increase or decrease of said one or more electric currents or voltages between said active region and said phase control region is opposite to each other; and
    an SHG device for receiving said modulated fundamental wave from said laser diode and for converting said modulated fundamental wave to a second harmonic wave.

2. The source of claim 1, wherein said means for modulating comprises means for modulating an electric current supplied to said active region, and means for controlling amount of electric current supplied to said phase control region so that heat transferred from said active region to said DBR region, and from said phase control region to said DBR region is substantially constant and said second harmonic wave is intensity modulated.

3. The source of claim 1, wherein said drive means further comprises means for compensating amount of wavelength or phase change occurring when a modulated electric current is supplied to said active region with amount of a modulated electric current supplied to said phase control region to cause lock wavelength of an output wave from said laser diode to be within a tolerance bandwidth of a phase matched wavelength of said SHG device.

4. The source of claim 1, wherein said means for modulating comprises means for varying pulse width, pulse count or combination of pulse width and pulse count of said one or more electric currents or voltages to cause said fundamental wave to be pulse modulated and said second harmonic wave to be intensity modulated.

5. The source of claim 1, further comprising a heater for supplying heat to said SHG device.

6. The source of claim 1, wherein said SHG device comprises an optical waveguide to which said fundamental wave is converted to a second harmonic wave which is outputted by said SHG device, and an electrode for supplying an electric to said optical waveguide.

7. The source of claim 1, wherein said drive means comprises:
    means for keeping constant a drive current supplied to said active region;
    means for supplying a variable drive current to said DBR region; and
    means supplying a variable drive current to said phase control region.

8. The source of claim 1, wherein said drive means comprises:
    means for supplying drive currents to both said DBR region and said phase control region which are between points which are close to an area of maximum power of said second harmonic wave, and at which power output thereof changes.

9. The source of claim 1, wherein said drive means comprises:
    means for supplying drive currents to both said DBR region and said phase control region which are with reference to a center between points where output power of said second harmonic wave changes toward a positive or a negative.

10. The source of claim 1, further comprising a collimator, a filter, a quarter wave plate, and an object lens.

11. The source of claim 1, further comprising a collimator lens, a polygon mirror, a mirror, and a photo sensitive drum.

12. A method of producing an SHG laser light, comprising the steps of:
    providing one or more electric currents or voltages to a laser diode;
    controlling said one or more electric currents or voltages supplied to said laser diode so as to modulate a fundamental wave produced by said laser diode; and
    converting said fundamental wave produced by said laser diode to a second harmonic wave; wherein
        said one or more electric currents or voltages are supplied to an active region of said laser diode, and to a phase control region of said laser diode so that said second harmonic wave is intensity modulated, and so that a sum of amounts of energy transferred from said active region to a DBR region of said laser diode, and from said phase control region to said DBR region,is substantially constant.

13. The method of claim 12, wherein said one or more electric currents or voltages are modulated so that the following equation holds true:

$$I1 \times V1 + I2 \times V2 - P = \text{constant}$$

wherein I1 is amount of electric current supplied to said active region, V1 is operating voltage of said active region, I2 is amount of electric current supplied to said phase control region, V2 is operating voltage of said phase control region, and P is output of said laser diode.

14. The method of claim 12, further comprising the steps of:
    compensating an amount of wavelength or phase change which occurs when said one or more electric currents or voltages supplied to said active region is modulated, with an amount of said one or more electric currents or voltages supplied to said phase control region; and
    locking a wavelength of said fundamental wave within a tolerance bandwidth of a phase matched wavelength of an SHG device which outputs said second harmonic wave.

15. The method of claim 12, further comprising the steps of:
    pulse modulating said fundamental wave by concurrently pulse modulating a plurality of said electric currents or voltages; and
    varying said one or more electric currents or voltages by pulse width, pulse count, or combination of pulse width and pulse count to cause said second harmonic wave to be intensity modulated.

16. The method of claim 12, wherein said active region produces said fundamental wave using said one or more electric currents or voltages; said phase control region adjusts a phase of said fundamental wave using said one or more electric currents or voltages thereby changing wavelength of said fundamental wave; and said DBR region adjusts reflection characteristics of a diffraction grating therein using said one or more electric currents or voltages wherein said fundamental wave is pulse modulated by pulse modulating said one or more electric currents or voltages supplied to at least one of said active region, said phase control region and said DBR region.

17. The method of claim 16, further comprising the step of controlling amount of electric current supplied to a heater which supplies heat to said laser diode to cause a sum of amounts of heat transferred from said active region to said DBR region and from said heater to said DBR region to be substantially constant.

18. The method of claim 16, further comprising the step of modulating an electric current supplied to a heater which supplies heat to an SHG device which provides said second harmonic wave to cause said second harmonic wave to be intensity modulated.

19. The method of claim 12, further comprising the step of modulating an electric field supplied to an optical waveguide of an SHG device which provides said second harmonic wave.

20. A method of producing laser light, comprising the steps of:
    keeping constant a drive current or voltage supplied to an active region of a laser diode; and
    varying at a specified rate of change a DBR drive current or voltage supplied to a DBR region of said laser diode, and a phase control drive current or voltage supplied to a phase control region of said laser diode to cause a second harmonic wave produced by an SHC device from a fundamental wave generated by said laser diode to be intensity modulated; wherein
        said DBP drive current and said phase control drive current are varied between points which are close to an area with maximum output power of said second harmonic wave and at which said output power changes, or are varied with reference to a center between points where output power of said second harmonic wave changes toward positive and negative.

* * * * *